(12) United States Patent
Lopez et al.

(10) Patent No.: US 11,942,587 B2
(45) Date of Patent: *Mar. 26, 2024

(54) LIGHT-EMITTING DEVICE WITH NANO-STRUCTURED LIGHT EXTRACTION LAYER

(71) Applicant: Lumileds LLC, San Jose, CA (US)

(72) Inventors: Toni Lopez, Vaals (NL); Aimi Abass, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/142,478

(22) Filed: May 2, 2023

(65) Prior Publication Data

US 2023/0290920 A1    Sep. 14, 2023

Related U.S. Application Data

(63) Continuation of application No. 17/701,319, filed on Mar. 22, 2022, now Pat. No. 11,682,752.

(Continued)

(51) Int. Cl.
*H01L 33/62* (2010.01)
*G09G 3/32* (2016.01)
(Continued)

(52) U.S. Cl.
CPC .............. *H01L 33/62* (2013.01); *G09G 3/32* (2013.01); *H01L 27/156* (2013.01);
(Continued)

(58) Field of Classification Search
CPC ....... H01L 33/62; H01L 33/005; H01L 33/42; H01L 33/58; H01L 2933/0066; G09G 3/32; G09G 2320/0686
See application file for complete search history.

(56) References Cited

U.S. PATENT DOCUMENTS 11,081,622 B2    8/2021    Wildeson et al.
11,355,480 B1    6/2022    Valentine
(Continued)

FOREIGN PATENT DOCUMENTS

KR    10-2020-0098669 A    8/2020
WO    2010/123809 A2    10/2010

OTHER PUBLICATIONS

From the International Application Division of the Korean Intellectual Property Office as the ISA, Notification of the International Search Report and the Written Opinion of the International Searching Authority, or the Declaration, PCT/US2022/021484, dated Jul. 13, 2022, 8 pages.

*Primary Examiner* — Kenneth B Lee, Jr.

(57) ABSTRACT

A semiconductor light-emitting device includes a junction or active layer between doped semiconductor layers coextensive over a contiguous device area, corresponding sets of electrical contacts connected to the semiconductor layers, and multiple nanostructured optical elements at a surface of one semiconductor layer opposite the other semiconductor layer. Composite electrical contacts of one set include a conductive layer, a transparent dielectric layer between the conductive and semiconductor layers, and vias through the dielectric layer connecting the conductive and semiconductor layers. The nanostructured elements redirect light, propagating laterally in optical modes supported by the semiconductor layers, to exit the device. The composite electrical contacts can be independent and define independently addressable pixel areas of the device. The nanostructured elements and thin semiconductor layers can yield high contrast between adjacent pixel areas without trenches between them. A drive circuit can provide drive current that differs among pixel areas.

20 Claims, 12 Drawing Sheets

Related U.S. Application Data

(60) Provisional application No. 63/168,637, filed on Mar. 31, 2021.

(51) Int. Cl.
  *H01L 27/15*  (2006.01)
  *H01L 33/00*  (2010.01)
  *H01L 33/42*  (2010.01)
  *H01L 33/58*  (2010.01)

(52) U.S. Cl.
  CPC ............ *H01L 33/005* (2013.01); *H01L 33/42* (2013.01); *H01L 33/58* (2013.01); *G09G 2320/0686* (2013.01); *H01L 2933/0066* (2013.01)

(56) References Cited

U.S. PATENT DOCUMENTS

| | | |
|---|---|---|
| 11,563,148 B2 | 1/2023 | Lopez |
| 11,682,752 B2 * | 6/2023 | Lopez ..................... H01L 33/58 345/82 |
| 2006/0284190 A1 | 12/2006 | Zimmerman |
| 2011/0156616 A1 | 6/2011 | Anderson et al. |
| 2012/0187427 A1 | 7/2012 | Chandra |
| 2015/0270437 A1 | 9/2015 | Peter |
| 2019/0273070 A1 | 9/2019 | Edmond et al. |
| 2020/0287088 A1 | 9/2020 | Jeon |
| 2021/0265526 A1 | 8/2021 | Thompson |
| 2021/0359179 A1 | 11/2021 | Lopez |

* cited by examiner

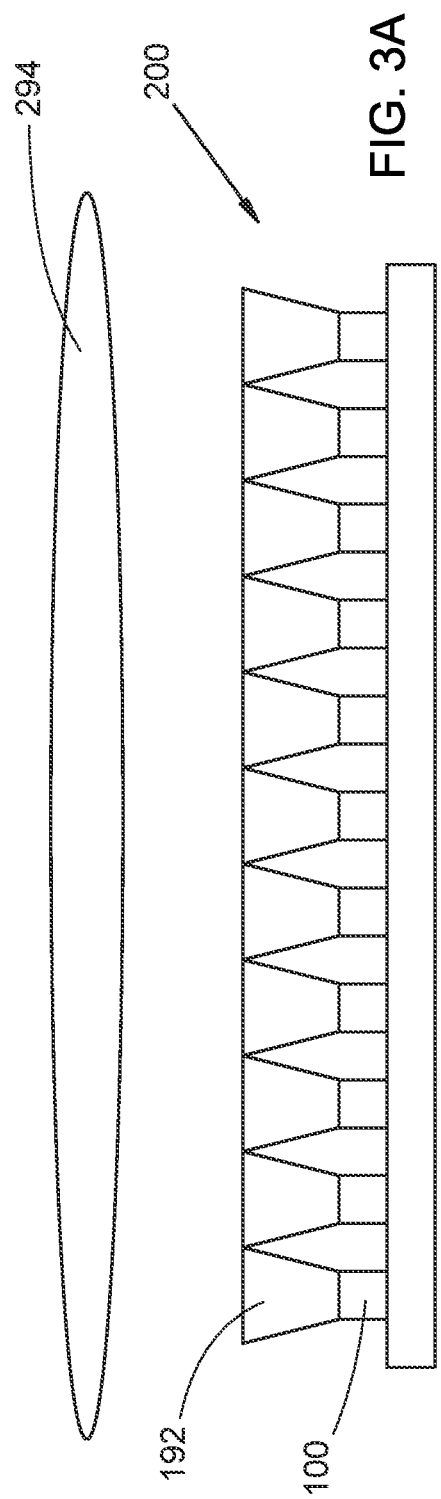
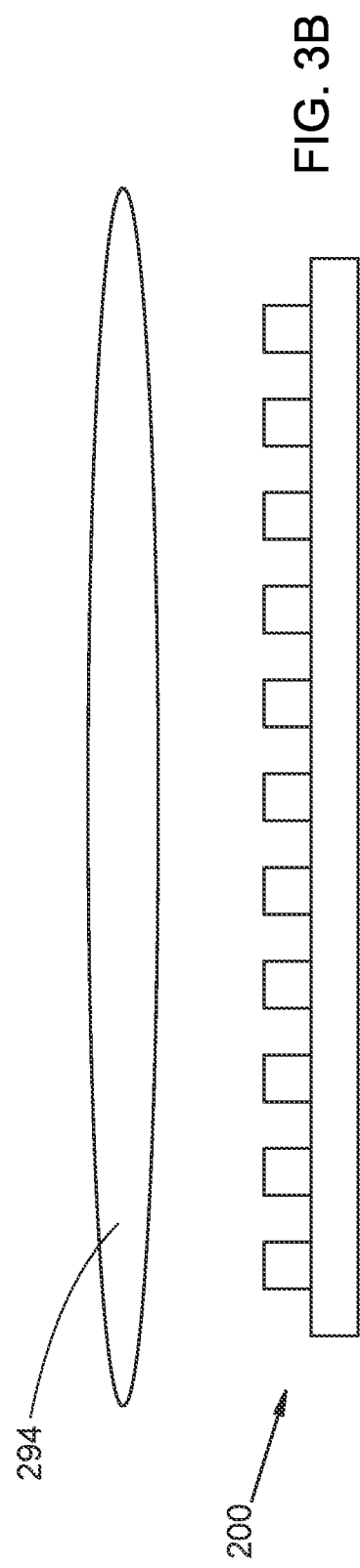

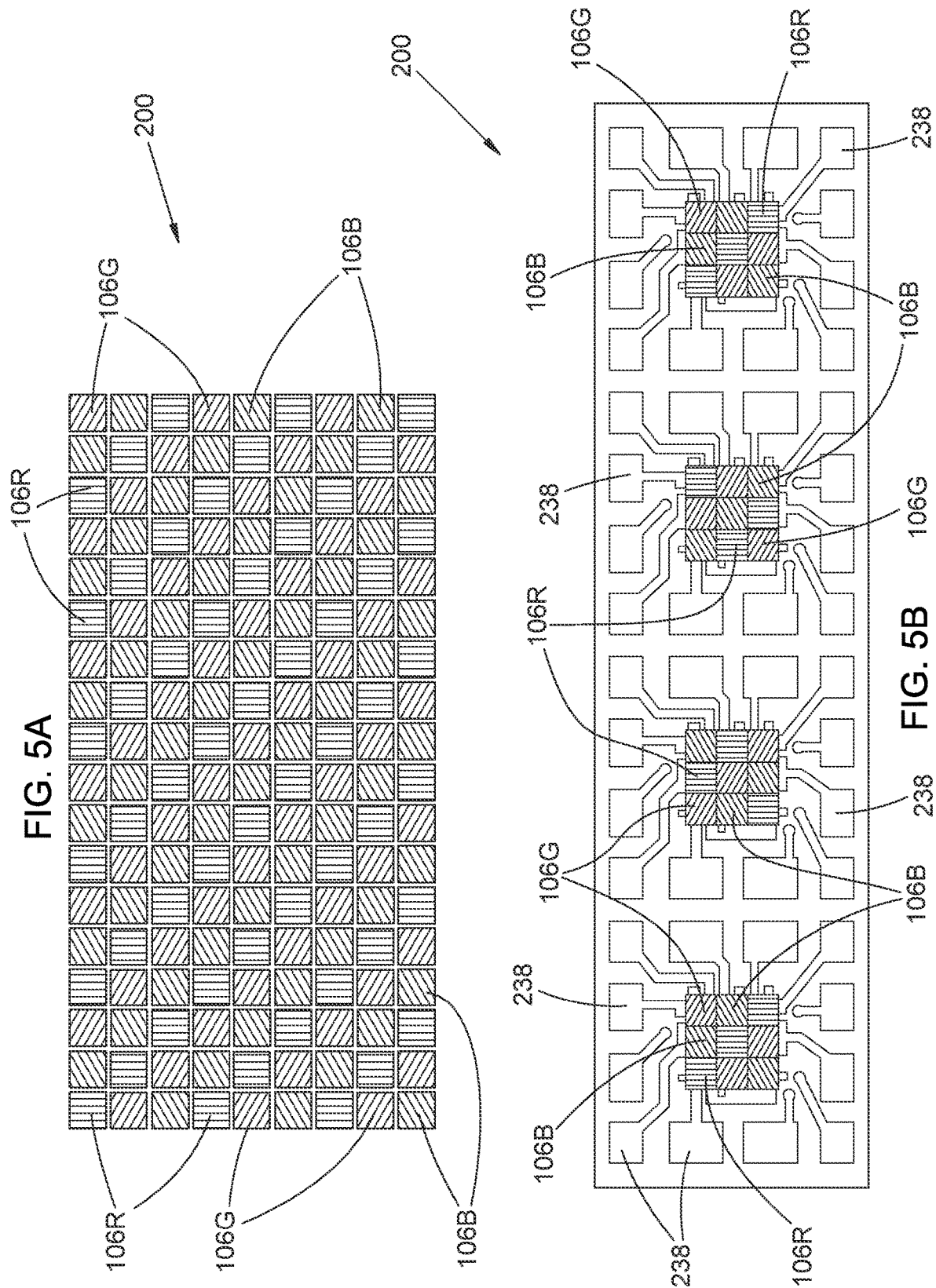

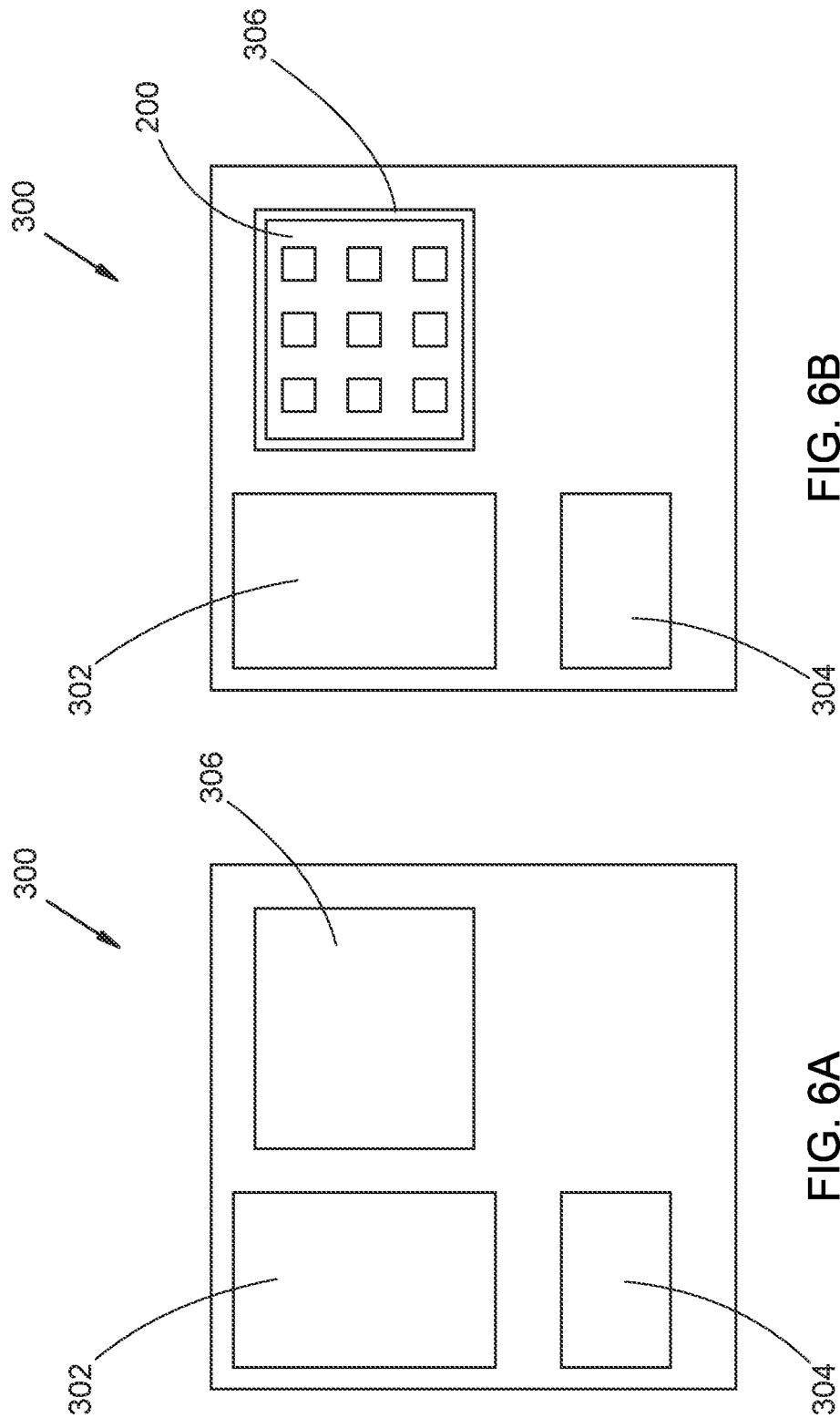

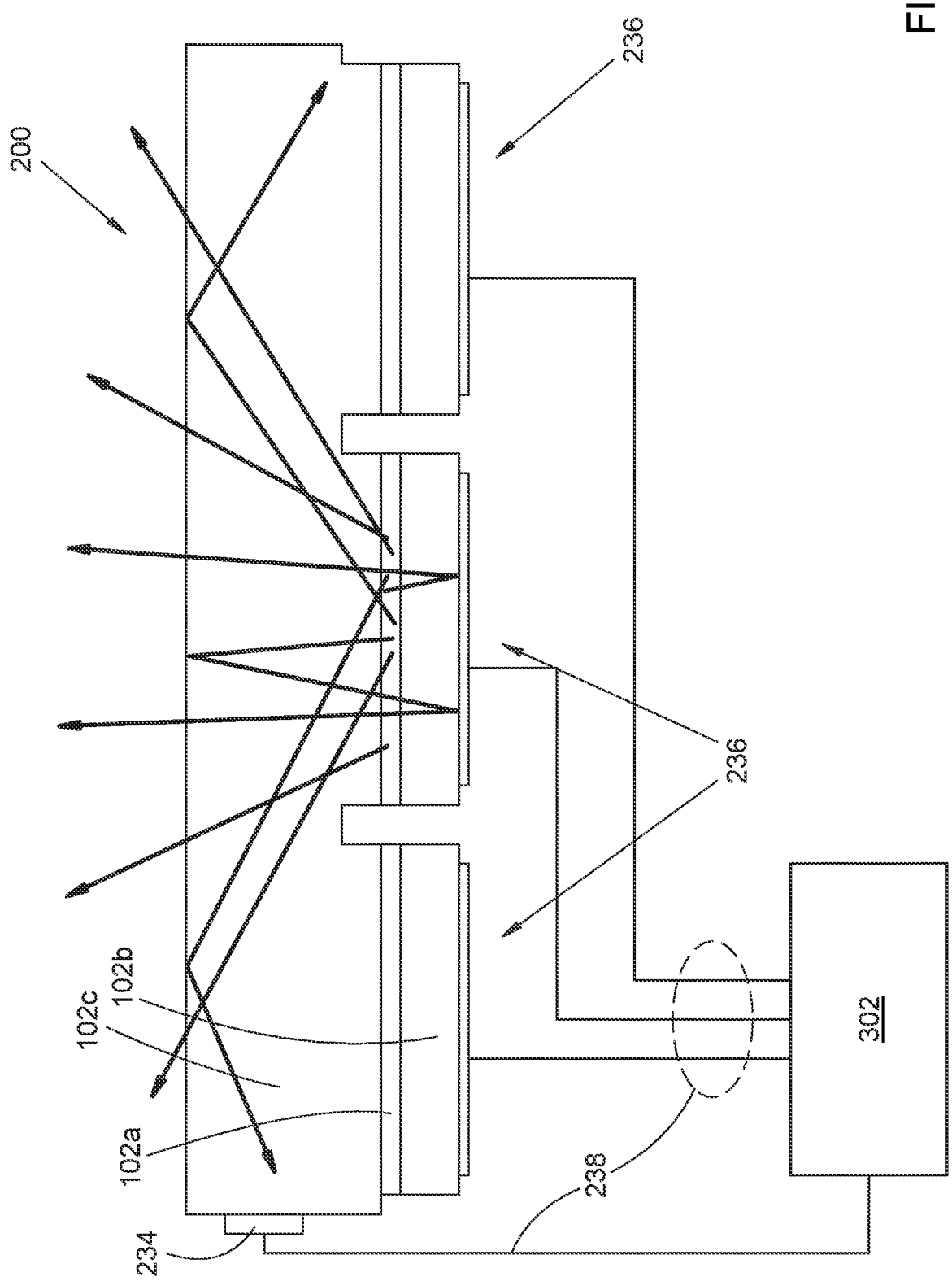

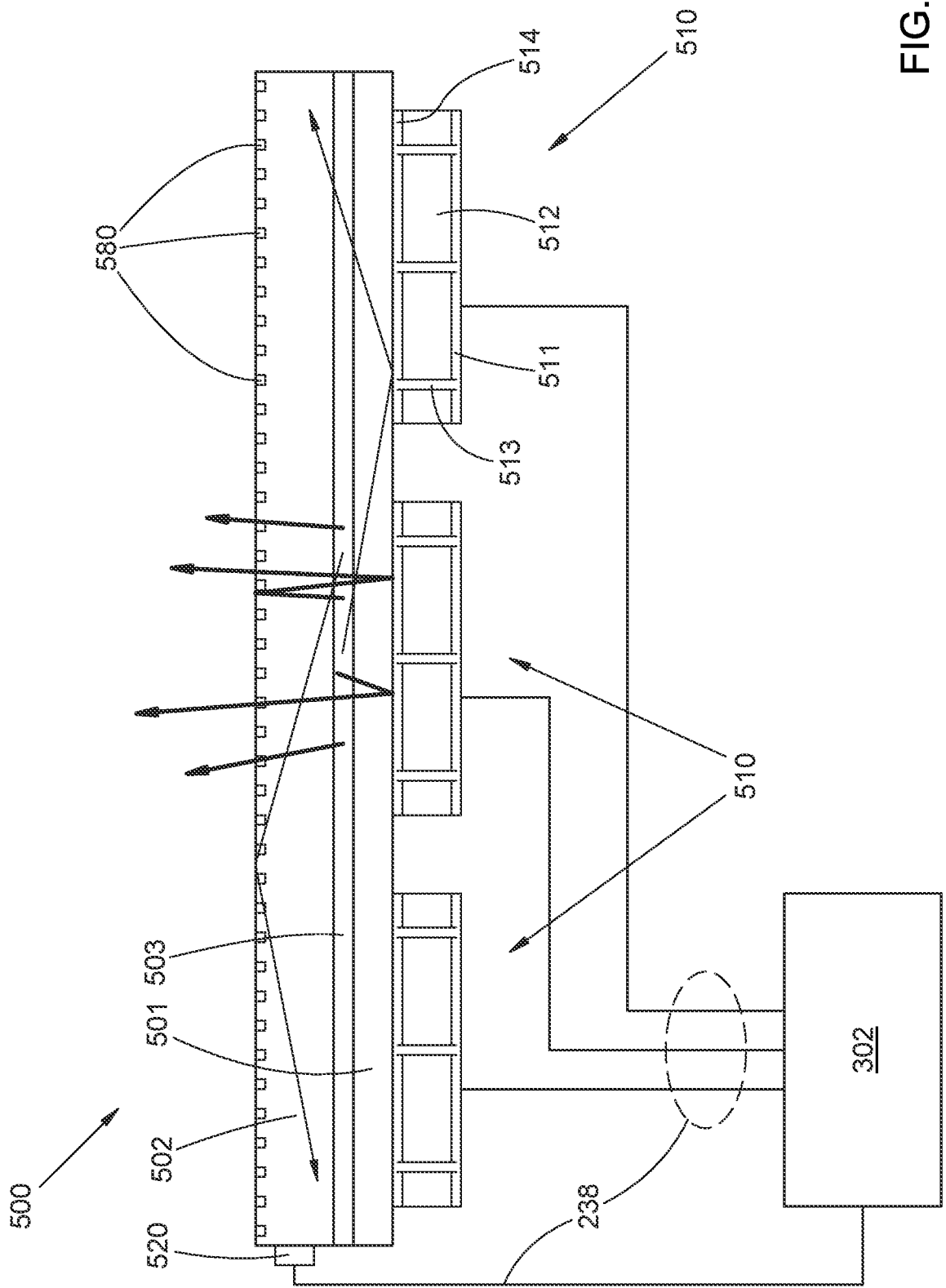

LIGHT-EMITTING DEVICE WITH NANO-STRUCTURED LIGHT EXTRACTION LAYER

This application is a continuation of U.S. non-provisional application Ser. No. 17/701,319 entitled "Light-emitting device with nano-structured light extraction layer" filed Mar. 22, 2022 in the names of Toni Lopez and Aimi Abass, which claims benefit of U.S. provisional App. No. 63/168,637 entitled "Light-emitting device with nano-structured light extraction layer" filed Mar. 31, 2021 in the names of Toni Lopez and Aimi Abass. Both of said applications are incorporated herein by reference in their entireties.

FIELD OF THE INVENTION

The invention relates generally to light-emitting diodes and to phosphor-converted light-emitting diodes.

BACKGROUND

Semiconductor light-emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a different, typically longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Multiple LEDs or pcLEDs can be formed together on a single substrate to form an array. Such arrays can be employed to form active illuminated displays, such as those employed in, e.g., smartphones and smart watches, computer or video displays, augmented- or virtual-reality displays, or signage, or to form adaptive illumination sources, such as those employed in, e.g., automotive headlights, camera flash sources, or flashlights (i.e., torches). An array having one or several or many individual devices per millimeter (e.g., device pitch of about a millimeter, a few hundred microns, or less than 100 microns, and spacing between adjacent devices less than 100 microns or only a few tens of microns or less) typically is referred to as a miniLED array or a microLED array (alternatively, a pLED array). Such mini- or microLED arrays can in many instances also include phosphor converters as described above; such arrays can be referred to as pc-miniLED or pc-microLED arrays.

SUMMARY

An inventive semiconductor light-emitting device includes first and second doped semiconductor layers with a junction or active layer between them, first and second sets of electrical contacts, and a set of multiple nanostructured optical elements. The first and second doped semiconductor layers that are arranged for emitting light at a nominal emission vacuum wavelength $\lambda_0$; that emission results from carrier recombination at a junction or active layer between the first and second semiconductor layers. The first and second semiconductor layers and the junction or active layer are coextensive over a contiguous area of the device. The first set of one or more electrical contacts is in electrical contact with the first semiconductor layer at its surface opposite the second semiconductor layer; the second set of one or more electrical contacts is in electrical contact with the second semiconductor layer. Each electrical contact of the first set is a composite electrical contact that includes (i) a corresponding electrically conductive layer extending over a corresponding areal region of the first surface of the first semiconductor layer within the contiguous area of the device, (ii) a corresponding substantially transparent dielectric layer between the corresponding conductive layer and the first semiconductor layer, and (iii) one or more corresponding electrically conductive vias through the corresponding dielectric layer, each via providing a localized, circumscribed electrical connection between the corresponding conductive layer and the first semiconductor layer. The set of multiple nanostructured optical elements is arranged at the first surface of the first semiconductor layer or at a surface of the second semiconductor layer opposite the first semiconductor layer. The arrangement of the set of nanostructured optical element results in redirection of at least a portion of light (at the nominal emission vacuum wavelength $\lambda_0$) propagating laterally in one or more selected optical modes supported by the first and second semiconductor layers to exit the device through the second semiconductor layer.

The first set of one or more electrical contacts of the inventive light-emitting device can include multiple independent composite electrical contacts. Each corresponding areal region of the first surface of the first semiconductor layer can be a discrete, circumscribed areal region separated from circumscribed areal regions of all other composite contacts of the device, so as to define a corresponding discrete pixel area of the light-emitting device. The set of multiple nanostructured optical elements can be arranged so that, of light emitted within each pixel area at the nominal emission vacuum wavelength $\lambda_0$ and that exits the device through the second semiconductor layer, (i) at least a specified minimum fraction of the exiting light exits from that pixel area, (ii) at most a specified maximum fraction of the exiting light exits the device from other, different pixel areas, or (iii) a contrast ratio of the fraction of light exiting from that pixel area to the fraction of light exiting one or more adjacent pixel areas exceeds a specified minimum contrast ratio.

The inventive light-emitting device can further include a drive circuit connected to the first and second sets of contacts by the electrically conductive traces or interconnects. The drive circuit can provide electrical drive current that flows through the device and causes the device to emit light, with corresponding portions of the electrical drive current flowing through one or more pixel areas of the device as corresponding pixel currents. Each pixel current magnitude can differ from at least one other pixel current magnitude, or from any other pixel current magnitude. The drive circuit can provide one or more specified spatial distributions across the device of the pixel current magnitudes provided to the corresponding pixel areas of the device. In such examples the spatial distribution of light emission intensity varies across the device according to the arrangement of the pixel areas across the device and the specified distribution among the pixel areas of the pixel current magnitudes provided by the drive circuit.

Objects and advantages pertaining to LEDs, pcLEDs, miniLED arrays, pc-miniLED arrays, microLED arrays, and pc-microLED arrays may become apparent upon referring to the examples illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 3A shows a schematic cross-sectional view of an example array of pcLEDs arranged with respect to waveguides and a projection lens. FIG. 3B shows an arrangement similar to that of FIG. 3A, but without the waveguides.

FIG. 5A is a schematic top view of a portion of an example LED display in which each display pixel is a red, green, or blue phosphor-converted LED pixel. FIG. 5B is a schematic top view of a portion of an example LED display in which each display pixel includes multiple phosphor-converted LED pixels (red, green, and blue) integrated onto a single die that is bonded to a control circuit backplane.

FIG. 6A shows a schematic top view an example electronics board on which an array of pcLEDs may be mounted, and FIG. 6B similarly shows an example array of pcLEDs mounted on the electronic board of FIG. 6A.

FIG. 7 shows a schematic cross-sectional diagram of an example of a conventional arrangement of a light-emitting device pixelated by etched trenches through a portion of the semiconductor layer structure. Heavy arrows indicate various possible light propagation paths from the light-emitting device in the center.

FIGS. 8A and 8B show schematic cross-sectional diagrams of examples of inventive light-emitting devices, each with a contiguous semiconductor layer structure that is pixelated using independent electrical contacts and a set of nanostructured optical elements. Heavy arrows indicate various more likely light propagation paths from the light-emitting device in the center; lighter arrows indicate various less likely light propagation paths from the light-emitting device in the center. In FIG. 8A the nanostructured optical elements are between the semiconductor layer structure and the electrical contacts; in FIG. 8B the nanostructured optical elements are at an exit surface of the light-emitting device.

The examples depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, individual LEDs may be exaggerated in their vertical dimensions or layer thicknesses relative to their lateral extent or relative to substrate or phosphor thicknesses. "Vertical" and "lateral" directions are defined only relative to a substrate or a layer structure, with "vertical" being perpendicular to the substrate or layers and "lateral" being parallel to them; they do not indicate any absolute direction in space or relative to any surrounding structure. "Transverse" is defined only relative to a light propagation direction, and so can be either vertical or lateral for laterally propagating light. Note that when a first structure or layer is described as "on" another, that encompasses arrangements with or without one or more intervening structures or layers. One structure or layer described as "directly on" another indicates that there is no intervening layer or structure. Any units or scales of any graphs or plots are arbitrary unless specifically indicated otherwise. The examples shown should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the invention. The detailed description illustrates by way of example, not by way of limitation, the principles of the invention.

Figure 1:
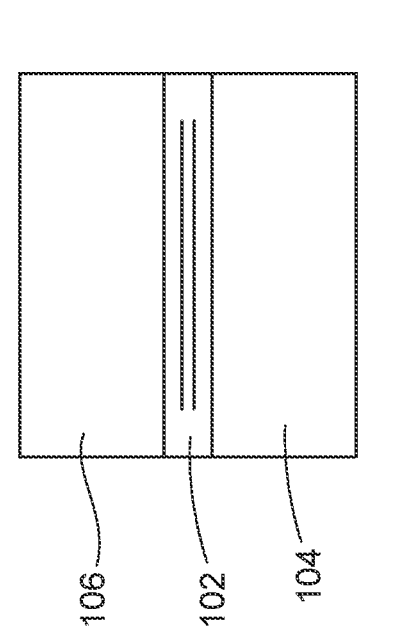
FIG. 1 shows a schematic cross-sectional view of an example pcLED.

FIG. 1 shows an example of an individual pcLED 100 comprising a semiconductor diode structure 102 disposed on a substrate 104, together considered herein an "LED" or "semiconductor LED", and a wavelength converting structure (e.g., phosphor layer) 106 disposed on the semiconductor LED. Semiconductor diode structure 102 typically comprises an active region disposed between n-type and p-type layers. Application of a suitable forward bias across the diode structure 102 results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Suitable material systems may include, for example, various III-Nitride materials, various III-Phosphide materials, various III-Arsenide materials, and various II-VI materials.

Any suitable phosphor materials may be used for or incorporated into the wavelength converting structure 106, depending on the desired optical output from the pcLED.

Figure 2A:
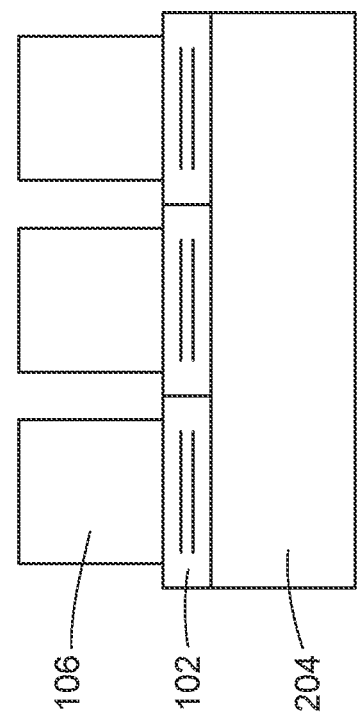
FIGS. 2A and 2B show, respectively, cross-sectional and top schematic views of an example array of pcLEDs.
Figure 2B:
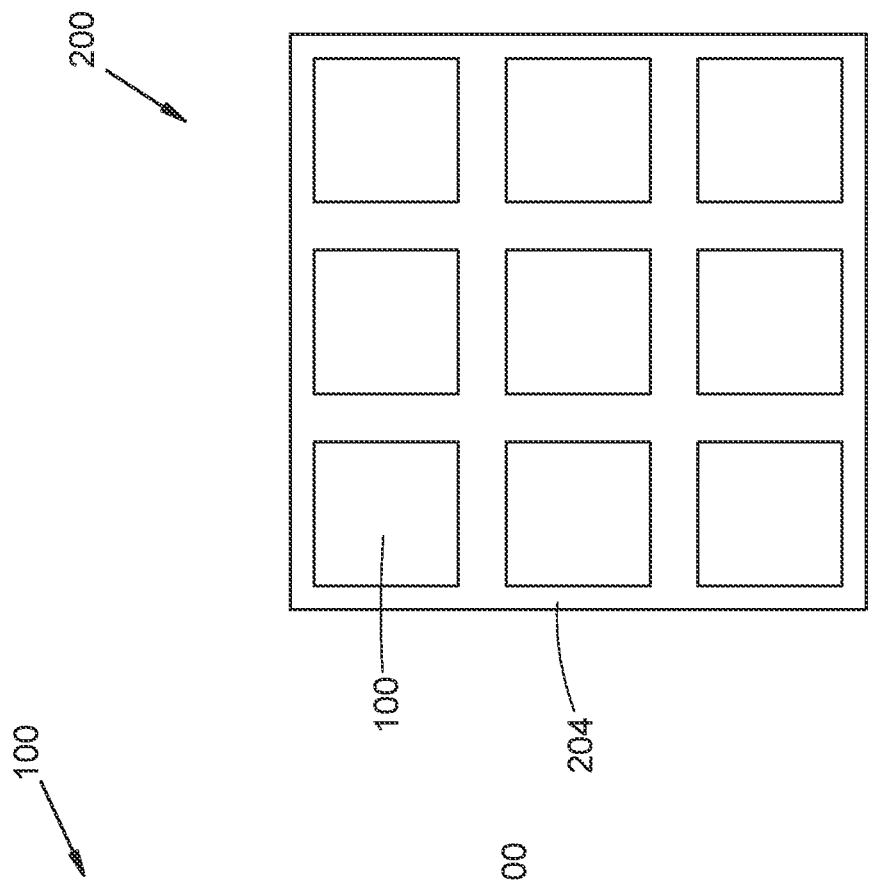

FIGS. 2A-2B show, respectively, cross-sectional and top views of an array 200 of pcLEDs 100, each including a phosphor pixel 106, disposed on a substrate 204. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 204 may optionally include electrical traces or interconnects, or CMOS or other circuitry for driving the LED, and may be formed from any suitable materials.

Individual pcLEDs 100 may optionally incorporate or be arranged in combination with a lens or other optical element located adjacent to or disposed on the phosphor layer. Such an optical element, not shown in the figures, may be referred to as a "primary optical element". In addition, as shown in FIGS. 3A and 3B, a pcLED array 200 (for example, mounted on an electronics board) may be arranged in combination with secondary optical elements such as waveguides, lenses, or both for use in an intended application. In FIG. 3A, light emitted by each pcLED 100 of the array 200 is collected by a corresponding waveguide 192 and directed to a projection lens 294. Projection lens 294 may be a Fresnel lens, for example. This arrangement may be suitable for use, for example, in automobile headlights. In FIG. 3B, light emitted by pcLEDs of the array 200 is collected directly by projection lens 294 without use of intervening waveguides. This arrangement may particularly be suitable when pcLEDs can be spaced sufficiently close to each other, and may also be used in automobile headlights as well as in camera flash applications. A miniLED or microLED display application may use similar optical arrangements to those depicted in FIGS. 3A and 3B, for example. Generally, any suitable arrangement of optical elements may be used in combination with the pcLEDs described herein, depending on the desired application.

Figure 4A:
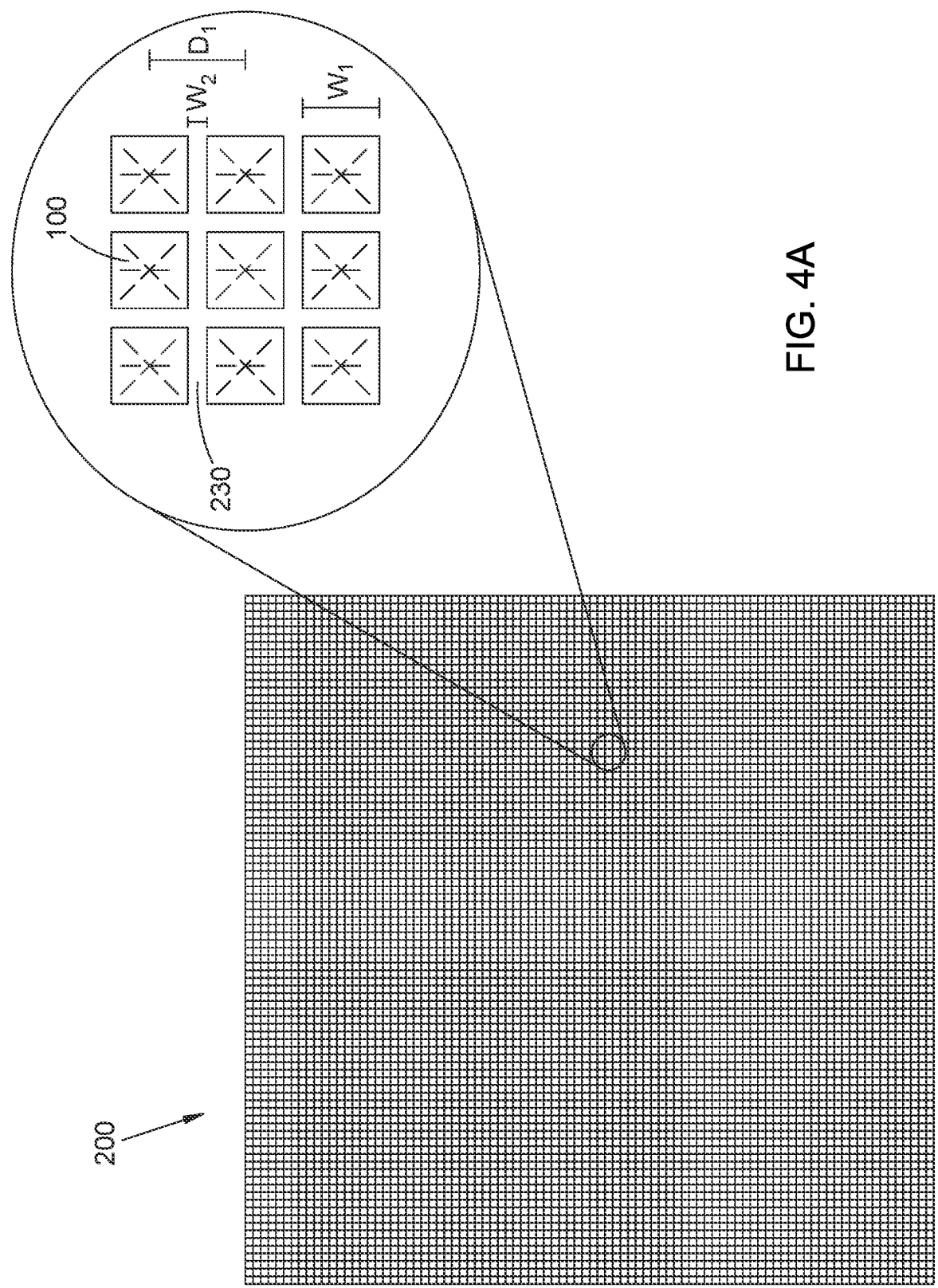
FIG. 4A shows a top schematic view of an example miniLED or microLED array and an enlarged section of 3×3 LEDs of the array.

Although FIGS. 2A and 2B show a 3×3 array of nine pcLEDs, such arrays may include for example on the order of $10^1$, $10^2$, $10^3$, $10^4$, or more LEDs, e.g., as illustrated schematically in FIG. 4A. Individual LEDs 100 (i.e., pixels) may have widths $w_1$ (e.g., side lengths) in the plane of the array 200, for example, less than or equal to 1 millimeter (mm), less than or equal to 500 microns, less than or equal to 100 microns, or less than or equal to 50 microns. LEDs 100 in the array 200 may be spaced apart from each other by streets, lanes, or trenches 230 having a width $w_2$ in the plane of the array 200 of, for example, hundreds of microns, less than or equal to 100 microns, less than or equal to 50 microns, less than or equal to 20 microns, less than or equal to 10 microns, or less than or equal to 5 microns. The pixel pitch Di is the sum of $w_1$ and $w_2$. Although the illustrated examples show rectangular pixels arranged in a symmetric matrix, the pixels and the array may have any suitable shape or arrangement, whether symmetric or asymmetric. Multiple separate arrays of LEDs can be combined in any suitable arrangement in any applicable format to form a larger combined array or display.

LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

Figure 4B:
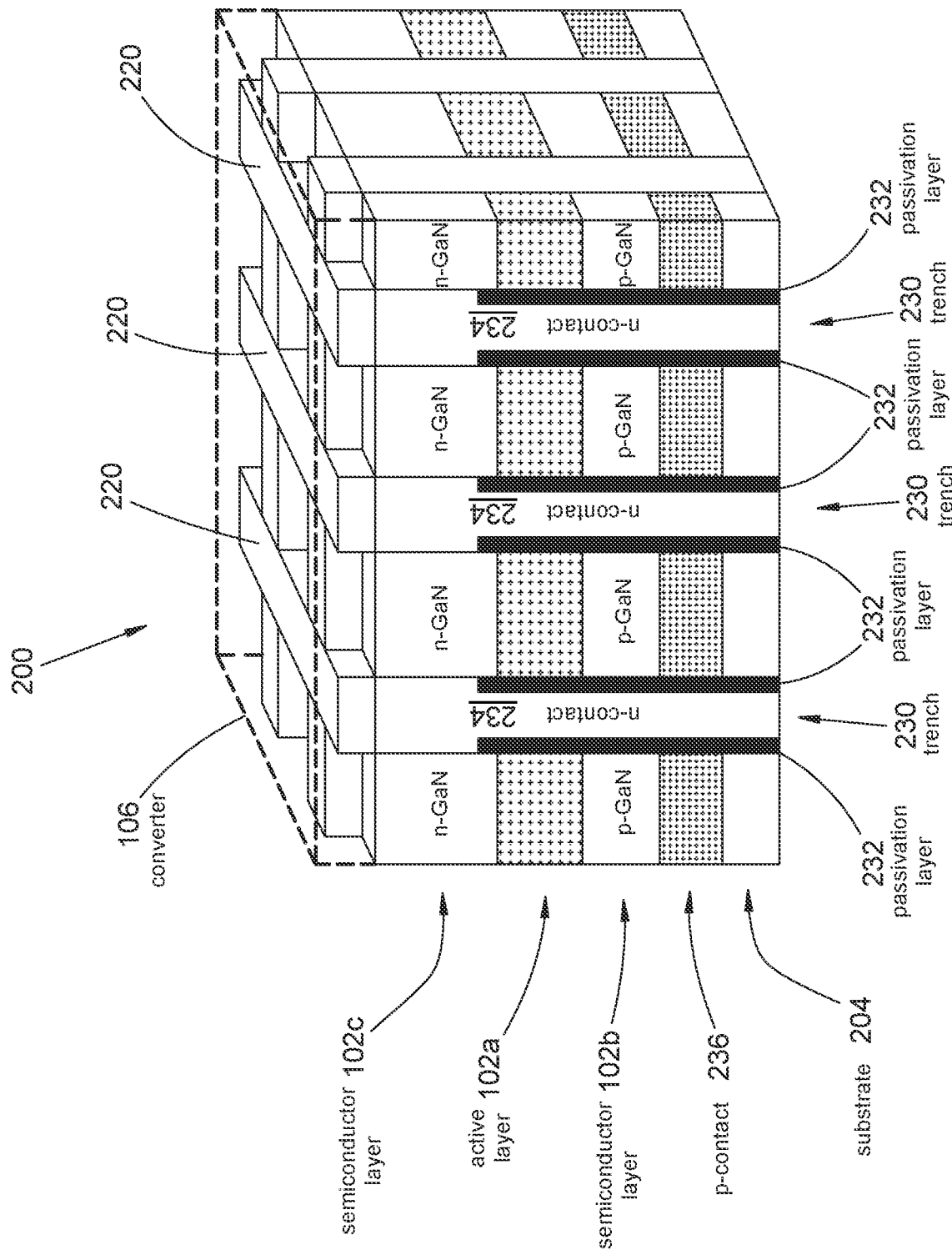
FIG. 4B shows a perspective view of several LEDs of an example pc-miniLED or pc-microLED array monolithically formed on a substrate.

An array of LEDs, miniLEDs, or microLEDs, or portions of such an array, may be formed as a segmented monolithic structure in which individual LED pixels are electrically isolated from each other by trenches and or insulating material. FIG. 4B shows a perspective view of an example of such a segmented monolithic LED array 200. Pixels in this array (i.e., individual semiconductor LED devices 102) are separated by trenches 230 which are filled to form n-contacts 234. The monolithic structure is grown or disposed on the substrate 204. Each pixel includes a p-contact 236, a p-GaN semiconductor layer 102b, an active region 102a, and an n-GaN semiconductor layer 102c; the layers 102a/102b/102c collectively form the semiconductor LED 102. A wavelength converter material 106 may be deposited on the semiconductor layer 102c (or other applicable intervening layer). Passivation layers 232 may be formed within the trenches 230 to separate at least a portion of the n-contacts 234 from one or more layers of the semiconductor. The n-contacts 234, other material within the trenches 230, or material different from material within the trenches 230 may extend into the converter material 106 to form complete or partial optical isolation barriers 220 between the pixels.

Figure 4C:
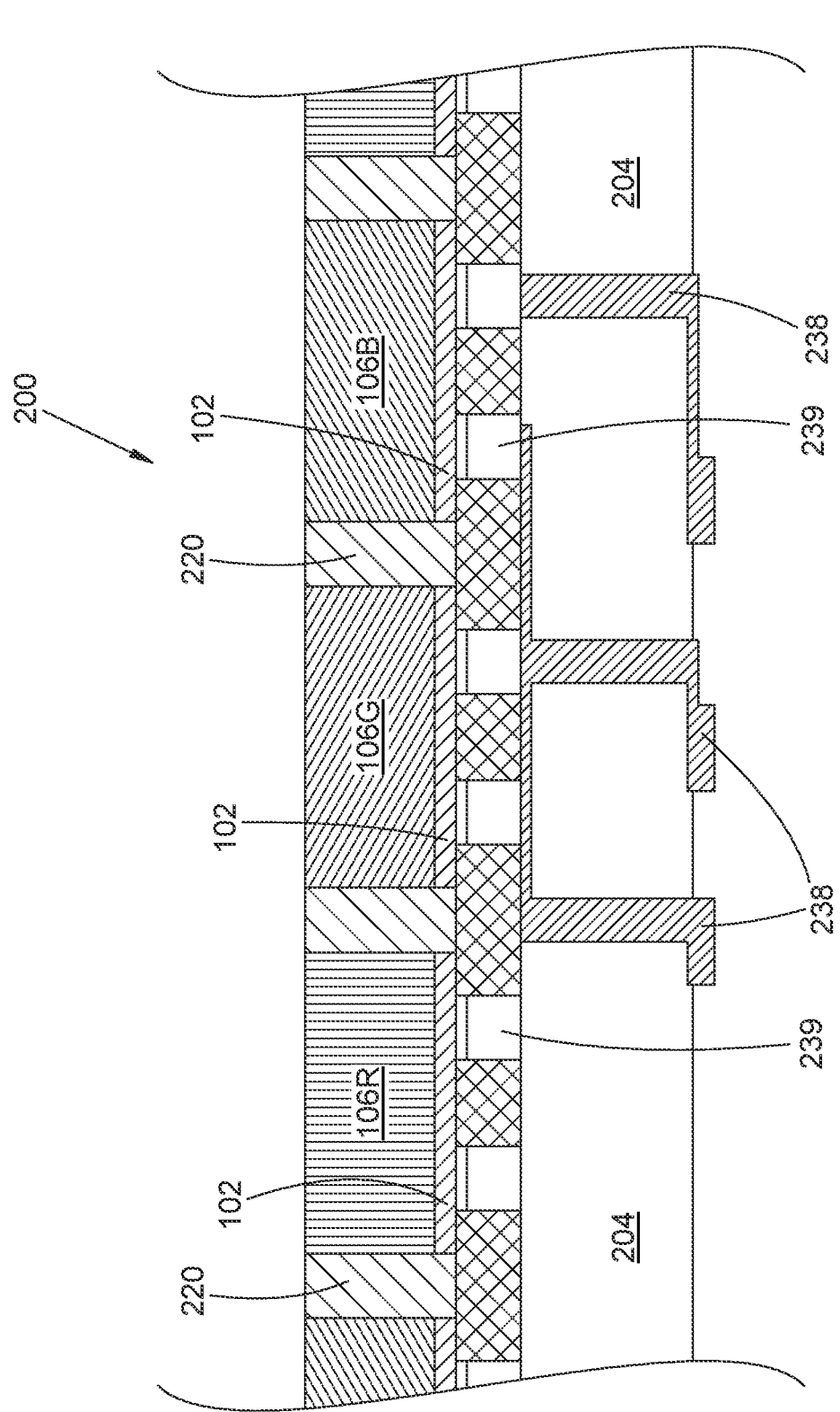
FIG. 4C is a side cross-sectional schematic diagram of an example of a close-packed array of multi-colored phosphor-converted LEDS on a monolithic die and substrate.

FIG. 4C is a schematic cross-sectional view of a close packed array 200 of multi-colored, phosphor converted LEDs 100 on a monolithic die and substrate 204. The side view shows GaN LEDs 102 attached to the substrate 204 through metal interconnects 239 (e.g., gold-gold interconnects or solder attached to copper micropillars) and metal interconnects 238. Phosphor pixels 106 are positioned on or over corresponding GaN LED pixels 102. The semiconductor LED pixels 102 or phosphor pixels 106 (often both) can be coated on their sides with a reflective mirror or diffusive scattering layer to form an optical isolation barrier 220. In this example each phosphor pixel 106 is one of three different colors, e.g., red phosphor pixels 106R, green phosphor pixels 106G, and blue phosphor pixels 106B (still referred to generally or collectively as phosphor pixels 106). Such an arrangement can enable use of the LED array 200 as a color display.

The individual LEDs (pixels) in an LED array may be individually addressable, may be addressable as part of a group or subset of the pixels in the array, or may not be addressable. Thus, light-emitting pixel arrays are useful for any application requiring or benefiting from fine-grained intensity, spatial, and temporal control of light distribution. These applications may include, but are not limited to, precise special patterning of emitted light from pixel blocks or individual pixels, in some instances including the formation of images as a display device. Depending on the application, emitted light may be spectrally distinct, adaptive over time, and/or environmentally responsive. The light-emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

FIGS. 5A and 5B are examples of LED arrays 200 employed in display applications, wherein an LED display includes a multitude of display pixels. In some examples (e.g., as in FIG. 5A), each display pixel comprises a single semiconductor LED pixel 102 and a corresponding phosphor pixel 106R, 106G, or 106B of a single color (red, green, or blue). Each display pixel only provides one of the three colors. In some examples (e.g., as in FIG. 5B), each display pixel includes multiple semiconductor LED pixels 102 and multiple corresponding phosphor pixels 106 of multiple colors. In the example shown each display pixel includes a 3×3 array of semiconductor pixels 102; three of those LED pixels have red phosphor pixels 106R, three have green phosphor pixels 106G, and three have blue phosphor pixels 106B. Each display pixel can therefore produce any desired color combination. In the example shown the spatial arrangement of the different colored phosphor pixels 106 differs among the display pixels; in some examples (not shown) each display pixel can have the same arrangement of the different colored phosphor pixels 106.

As shown in FIGS. 6A and 6B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

In many previous examples (including some of those shown above), multiple individual LED devices 102 are formed monolithically on a common layered semiconductor structure by etching trenches to form mesa-like structures separated by the trenches (e.g., as in FIG. 7). Each mesa forms a separate LED device or pixel 102, with the trenches extending through at least one (and sometimes both) of the doped semiconductor layers and the junction or active layer between them. In the example of FIG. 7, trenches extend entirely through the p-type semiconductor layer 102b and the active layer 102a, but only partly through the n-type semiconductor layer 102c. In this common arrangement the partly etched layer 102c holds the multiple LED devices 102 together in a monolithically integrated array 200. Drive current can be directed through each mesa independently of the others, laterally confined by the surrounding trench walls, so that the corresponding pixel 102 is independently addressable. However, as pixel sizes or spacings get smaller, a number of factors limit light output from each pixel, contrast between adjacent pixels 102, or both.

One such factor is decreased internal quantum efficiency of light emission due to non-radiative carrier recombination at defect sites at the etched sidewalls. Such defects are an unavoidable byproduct of the etch process, and their relative importance increases with decreasing pixel size; as transverse pixel size decreases, sidewall perimeter decreases linearly while emission area decreases quadratically. For pixel sizes greater than, e.g., 50 or 100 μm across, the effect of recombination at sidewall defects is relatively unimportant, or at least tolerable. As pixel size shrinks to 20 μm, 10 μm, or even less, a greater fraction of overall carrier recombination is non-radiative recombination at the sidewalls, and internal quantum efficiency suffers accordingly.

Another factor is increasingly difficult light extraction as pixel size decreases. A common method for increasing light extraction from a semiconductor LED is to provide texturing of the light-exit surface of the device. Such texturing can be formed by growing the semiconductor layers on a substrate having corrugations or other similar surface structural features, or by depositing a layer of scattering particles on the light-exit surface. However, the resulting structures typically have feature sizes of at least several microns or several tens of microns, and so cannot be readily implemented on an LED pixel that is too small, e.g., less than 5 or 10 μm across. Even if structurally realizable at such small pixel sizes, such light-extraction surface features would severely degrade contrast between adjacent pixels. The common arrangement of FIG. 7, with inter-pixel trenches extending only partly through one of the semiconductor layers, also permits light emitted from one pixel 102 to propagate into end exit the array from a different pixel 102, as indicated by some of the heavy arrows in FIG. 7.

Accordingly, it would be desirable to provide a light-emitting device that exhibits adequate, desirable, or improved levels of internal quantum efficiency or light extraction. It would be desirable to provide a monolithic array of LED pixels, including arrays having pixels sizes less than 20 μm, 10 μm, or even 5 μm, while maintaining such levels of internal quantum efficiency or light extraction, or adequate, desirable, or improved levels of pixel contrast.

Figure 8A:
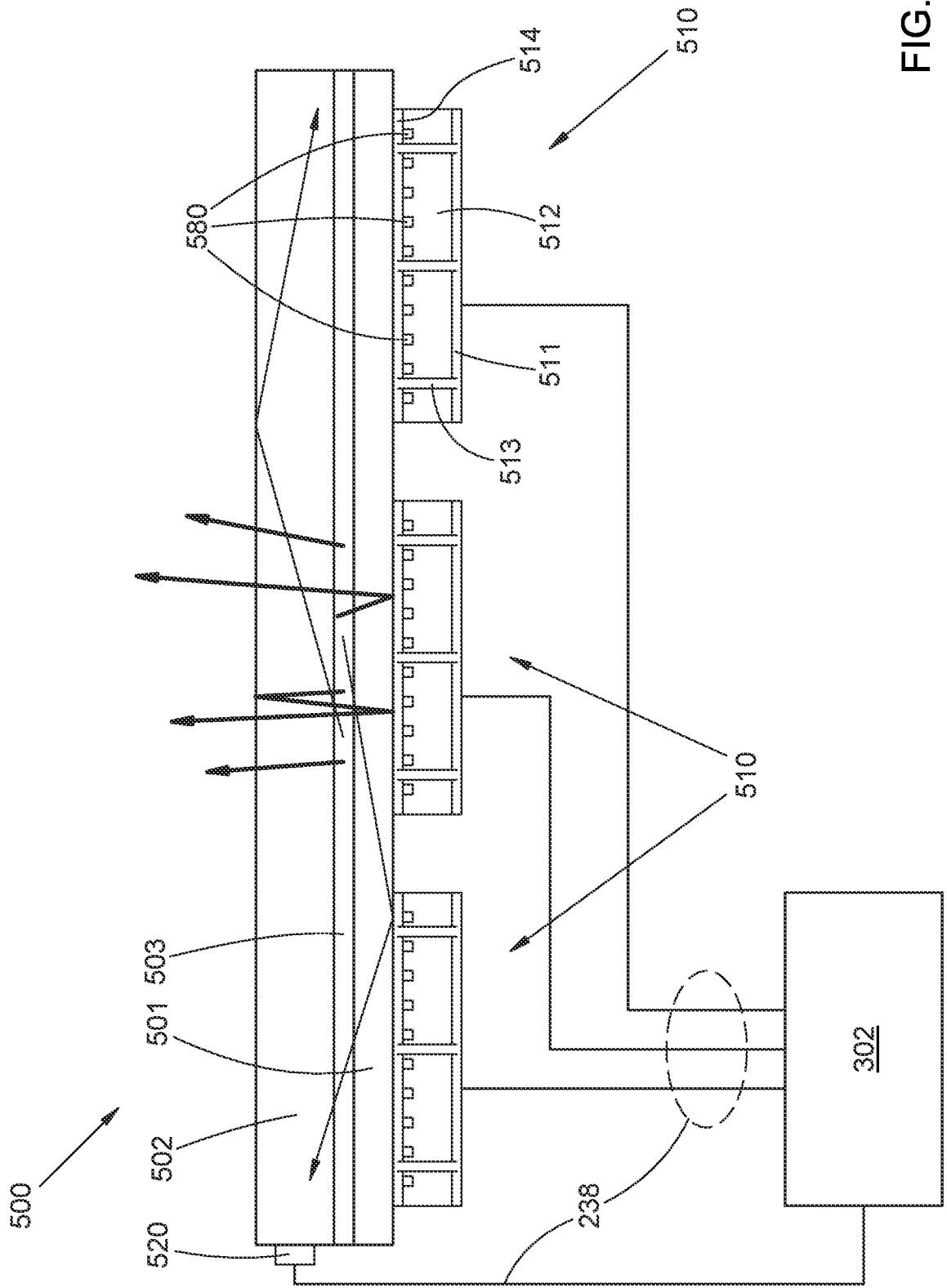

Examples of inventive light-emitting devices 500 are illustrated schematically in FIGS. 8A and 8B. Each includes first and second doped semiconductor layers 501 and 502 with a junction or active layer 503 between them, first and second sets of electrical contacts 510 and 520, and a set of multiple nanostructured optical elements 580. The first and second doped semiconductor layers 501 and 502 are arranged for emitting light at a nominal emission vacuum wavelength $\lambda_O$ that results from carrier recombination at the junction or active layer 503. The first and second semiconductor layers 501 and 502, as well as the junction or active layer 503, are coextensive over a contiguous area of the device 500, i.e., not divided by any trench within that contiguous area. In some examples each of the semiconductor layers 501 and 502 can include one or more III-V semiconductor materials, or alloys, derivatives, or mixtures thereof. In some common examples various doped GaN-type materials can be employed, or various derivatives or alloys thereof; in some other common examples various doped GaAs-type or InP-type materials, or various derivatives or alloys thereof, can be employed. In many common examples the device 500 includes one or more quantum wells or multi-quantum wells as the active layer 503 between the semiconductor layers 503. Such active layers can be tuned to emit light at a selected nominal emission vacuum wavelength $\lambda_O$ (e.g., emission typically in a band perhaps 10 to 50 nm wide that includes $\lambda_O$). The nominal emission vacuum wavelength typically can be in the near-UV, visible, or near-IR portions of the electromagnetic spectrum, e.g., between about 0.30 μm and about 2.5 μm, between about 0.35 μm and about 0.8 μm, or between about 0.7 μm and about 1.7 μm.

The one or more electrical contacts 510 of the first set are in electrical contact with the first semiconductor layer 501 at its first surface opposite the second semiconductor layer 502 (meaning that the semiconductor layer 501 is between the contacts 510 and the semiconductor layer 502). As a result of that arrangement, light emitted by the device 500 mostly exits through the second semiconductor layer 502. Each of the electrical contacts 510 is a composite electrical contact that includes a corresponding electrically conductive layer 511, a corresponding substantially transparent dielectric layer 512 between the corresponding conductive layer 511 and the first semiconductor layer 501, and one or more corresponding electrically conductive vias 513. "Substantially transparent" in this context indicates that, over at least the range of wavelengths of the emitted light that includes $\lambda_0$, a fraction of light is transmitted that is sufficiently large for the light-emitting device 500 to function as needed, intended, or desired. Each contact 510 extends over a corresponding areal region of the first surface of the first semiconductor layer 510 within the contiguous area of the device 500. Each via 513 extends through the corresponding dielectric layer 512 and provides a localized, circumscribed electrical connection between the corresponding conductive layer 511 and the first semiconductor layer 501. In some examples the electrically conductive layer 511 or the vias 513, or both, of each composite contact 510 can include one or more metals or metal alloys. In some examples the dielectric layer 512 of each composite contact 510 can include doped or undoped silica, one or more doped or undoped metal or semiconductor oxides, nitrides, or oxynitrides, or combinations or mixtures thereof. The composite contacts 510 can and typically do act as optical reflectors that redirect incident light to propagate generally toward the second semiconductor layer 502 and an exit surface of the device 500.

In some examples, the vias 513 connect the conductive layers 511 directly to the first semiconductor layer 501, and the dielectric layers 512 are in direct contact with the semiconductor 501. In other examples, each composite electrical contact 510 further includes a corresponding substantially transparent electrode layer 514 between the corresponding dielectric layer 512 and the first semiconductor layer 510; the electrode 514 is in direct contact with the semiconductor layer 501. In such examples each via 513 provides an electrical connection between the corresponding conductive layer 511 and the first semiconductor layer 501 by providing an electrical connection between the corresponding conductive layer 511 and the corresponding electrode layer 514. Suitable materials for forming the electrode layer 514 can include one or more of indium tin oxide, indium zinc oxide, one or more other transparent conductive oxides, or combinations or mixtures thereof.

The second set of one or more electrical contacts 520 is in electrical contact with the second semiconductor layer 502, and can be of any suitable type or arrangement. In some examples the contacts 520 can include any one or more of, e.g., (i) one or more substantially transparent electrodes at the surface of the second semiconductor layer 502 opposite the first semiconductor layer 501 (i.e., at the exit surface of the device 500), (ii) one or more secondary vias (not shown) passing through and electrically insulated from the first semiconductor layer 501 and the junction or active layer 503, (iii) one or more edge contacts, or (iv) one or more peripheral areal contacts.

Light emitted at the junction or active layer 503 can propagate generally toward the exit surface of the device 500 or generally toward the contacts 510 to be reflected generally toward the exit surface of the device 500 (as indicated by some of the heavy arrows in FIGS. 8A and 8B), or can propagate laterally within the semiconductor layers 501 and 502 (as indicated by the lighter arrows in FIGS. 8A and 8B). The semiconductor layers 501 and 502 can act as a waveguide supporting optical modes confined vertically (i.e., in a direction perpendicular to the layers 501 and 502) in which light can propagate laterally (i.e., parallel to the layers 501 and 502). Light propagating laterally in such supported modes is undesirable because it represents lost emission intensity, and because it can propagate into adjacent pixels of a light-emitting array and degrade pixel contrast. The multiple nanostructured optical elements 580 are positioned at the first surface of the first conductive layer 501 (e.g., as in FIG. 8A) or at the device exit surface (e.g., as in FIG. 8B, with the surface of the second semiconductor layer 502 opposite the first semiconductor layer 501 acting as the exit surface). The nanostructured optical elements 580 are arranged to redirect at least a portion of light (at the nominal emission vacuum wavelength $\lambda_0$), that propagates laterally in one or more of the supported optical modes, to exit the device 500 through the second semiconductor layer 502 and the device exit surface (as indicated by some of the heavy arrows in FIGS. 8A and 8B).

Thickness of the dielectric layers 512 is typically sufficiently large so as to reduce spatial overlap of the laterally propagating modes with the conductive layer 511, to reduce or eliminate absorption loss due to that layer. In some examples thickness of the dielectric layer 512 can be greater than 0.1 µm, greater than 0.2 µm, greater than 0.3 µm, or greater than 0.5 µm; in some examples thickness of the dielectric layer can be about 0.5 µm.

For purposes of this disclosure, those propagating optical modes supported by the semiconductor layer structure of the device 500 that have qualitatively similar vertical intensity profiles (e.g., same numbers of peaks and nodes), regardless of lateral propagation direction or lateral intensity profile, shall be referred to collectively as only one mode among the supported optical modes. Typical conventional light-emitting devices typically have semiconductor layers, with a junction or active layer between them, having a total thickness greater than 5 µm, 7 µm, 10 µm, or even larger. Such thick semiconductor structures can in some instances support more than 20, more than 30, or even more propagating optical modes. With light propagating in so many different optical modes in a conventional, relatively thick light-emitting device, achieving efficient redirection using nanostructured optical elements is problematic. Typically the size, shape, and arrangement of such nanostructured elements can be optimized simultaneously for only a few optical modes (e.g., 10 or fewer). If too many different modes are present, there is an inherent limit to the fraction of laterally propagating light that can be redirected to exit the device, because a significant fraction of that light propagates in optical modes that are not efficiently redirected by the nanostructured optical elements.

Figure 10A:
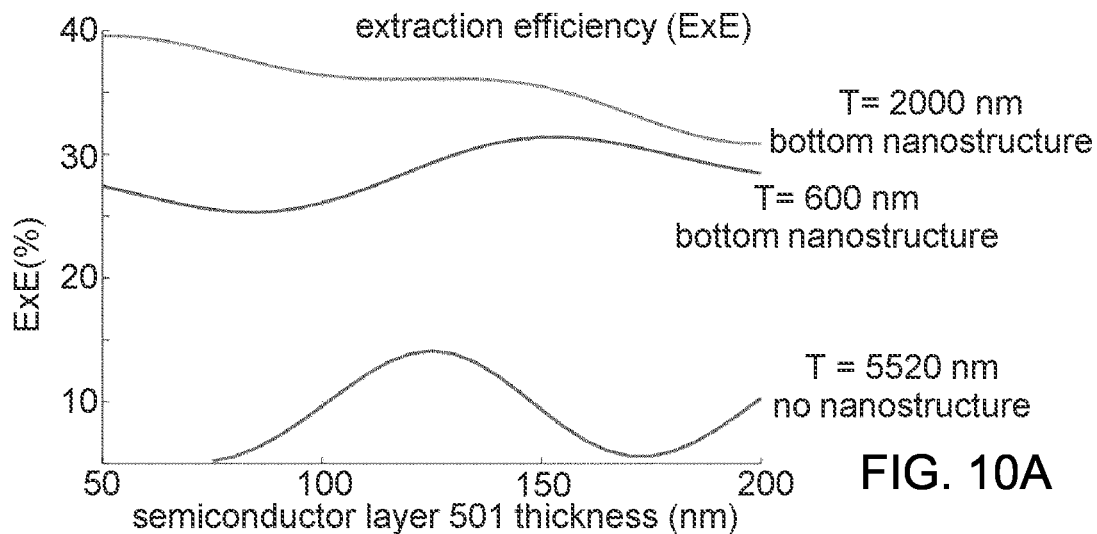
FIGS. 10A-10C are plots of calculated extraction efficiency, Purcell factor, and their product, respectively, for two example inventive light-emitting devices of different thicknesses compared to those of a conventional light-emitting device.

Accordingly, in some examples of the inventive light-emitting device 500, the total thickness of the semiconductor layers 501 and 502, and the junction or active layer 503 between them, can be reduced to reduce the number of different laterally propagating modes supported by the semiconductor layer structure of the light-emitting device 500. In some examples the semiconductor layer structure can support at most 15, 10, 8, 5, or 3 laterally propagating optical modes. To achieve that, in some examples the non-zero total thickness of the first and second semiconductor layers 501 and 502, and the junction or active layer 503 between them, can be less than about 5 µm, less than about 3 µm, less than about 2 µm, less than about 1.5 µm, or less than about 1.0 µm. With the number of supported optical modes thus reduced, the nanostructured optical elements 580 can be optimized for redirecting light propagating in the correspondingly reduced number of optical modes, so that a higher overall fraction of laterally propagating light can be redirected to exit the device 500. FIG. 10A shows plots of calculated extraction efficiency for two different devices 500 with nanostructured optical elements 580 and total thickness of the semiconductor layers 501 and 502 and the junction or active layer 503 of 0.6 μm and 2 μm compared to a reference device having an overall thickness of 5.52 μm and no elements 580. Extraction efficiency is plotted as a function of thickness of the semiconductor layer 501 (discussed further below), and shows significant enhancement of extraction efficiency for the thinner devices 500.

In addition to increasing extraction efficiency (and therefore overall emission efficiency), the reduction in the number of laterally propagating modes also enables at least some degree of optimization of the nanostructured optical elements 580 to achieve, or at least approximate, a desired distribution of propagation directions for light exiting the device 500 (e.g., to achieve an angular distribution narrower than a Lambertian distribution typical of many conventional light-emitting devices). In some examples an angular distribution of emission intensity can be generated that is narrower than, e.g., a commonly occurring Lambertian distribution. Typically, a narrower or more well-defined angular distribution of emission can be obtained as thickness of the semiconductor layer structure of the light-emitting device 500 decreases and fewer laterally propagating optical modes are supported.

Figure 10B:
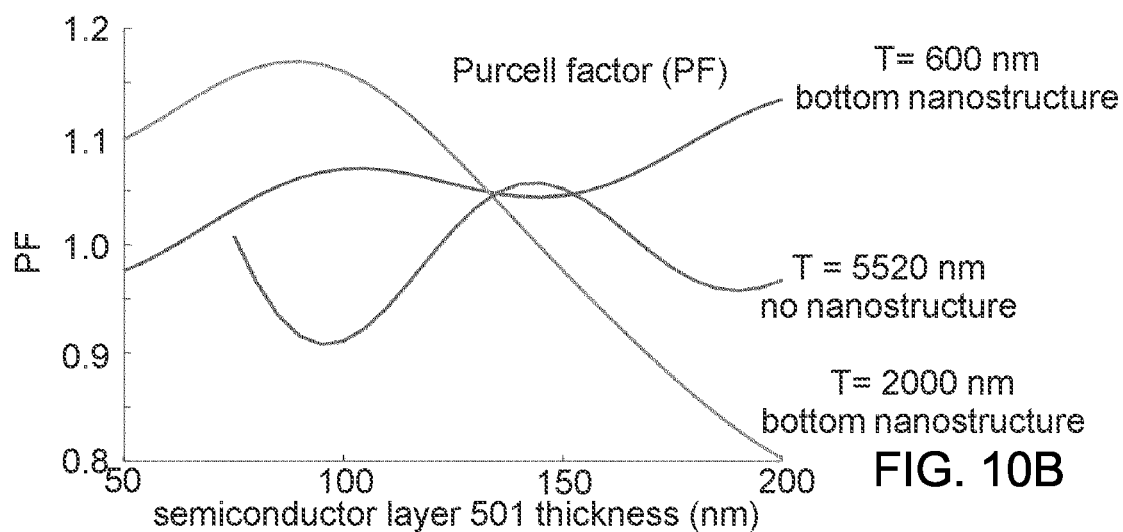
Figure 10C:
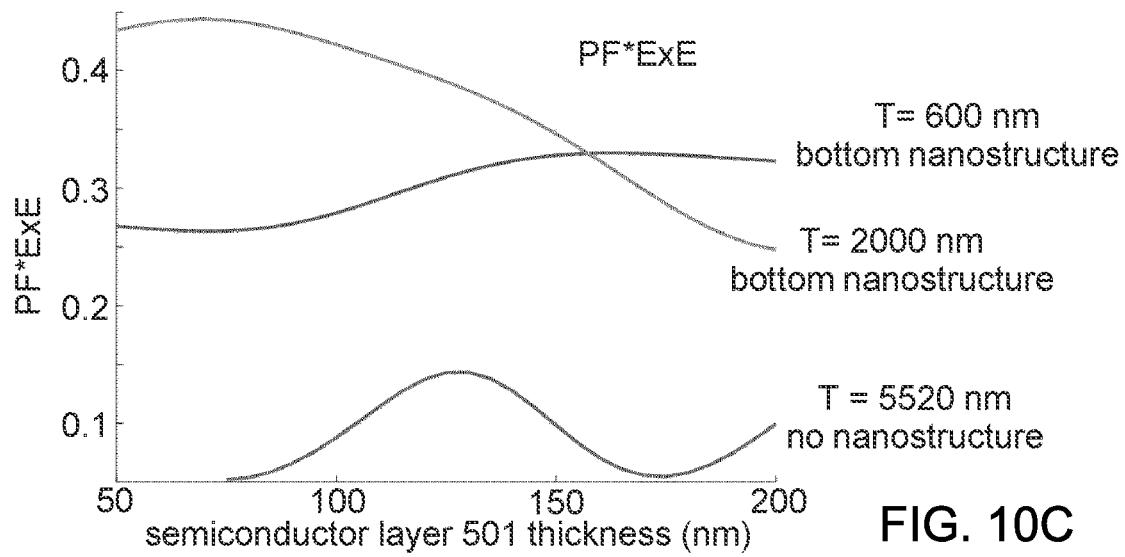

Overall efficiency of emission can also be increased by selection of a thickness of the first semiconductor layer 501. A resonator-like structure is formed by the composite contacts 510 (acting as a backside reflector) and the semiconductor layers 501 and 502 with the junction or active layer 503 between them. Proper tuning of the position of the junction or active layer 503 within that resonator-like structure, by selection of the relative thicknesses of the layers 501 and 502, can result in enhancement of the device's Purcell factor and a concomitant increase in the internal quantum efficiency of the device 500 (i.e., fraction of injected charge carriers converted to photons emitted at the junction or active layer 503). Calculated Purcell factors are plotted in FIG. 10B for the same three devices as in FIG. 10A as a function of thickness of the semiconductor layer 501. A product of the calculated extraction efficiency and calculated Purcell factor are plotted in FIG. 10C, and show clear enhancement of overall emission efficiency for the inventive device 500 with reduced thickness of the semiconductor layer structure and the nanostructured optical elements 580. In some examples of an inventive device 500, non-zero thickness of the semiconductor layer 510 can be less than about 1.0 μm, less than about 0.8 μm, less than about 0.5 μm, or less than about 0.3 μm, and can be selected to result in an adequate, desirable, or improved extraction efficiency, internal quantum efficiency, Purcell factor, or overall emission efficiency. In some examples the semiconductor layer 501 can be a p-doped semiconductor layer while the semiconductor layer 502 can be an n-doped semiconductor layer.

Although FIGS. 8A and 8B show multiple discrete contacts 510, the inventive arrangements and advantages thereof described above are applicable to a single, contiguous light-emitting device 500 for providing improved or enhanced emission efficiency or directionality of emission. However, when implemented as shown in FIGS. 8A and 8B to form an array of independent light-emitting pixels on the device 500, additional advantages can be realized. In some examples of an inventive light-emitting device 500, the electrical contacts 510 can include multiple independent composite electrical contacts 510. "Independent" here indicates that there is no direct electrically conductive path between different composite contacts 510; the only connections between different contacts 510 in such examples are indirect, e.g., by two different contacts 510 both being connected to the semiconductor layer 501, or by both being connected to a common drive circuit 302 by separate traces or interconnects 238. In some examples each composite contact 510 can be connected to a single corresponding one of the traces or interconnects 238 that is different from a corresponding trace or interconnect 238 connected to at least one other composite contact 510 (i.e., there are at least two independent groups of contacts 510). In some examples each composite contact 510 can be connected to a single corresponding one of the traces or interconnects 238 that is different from a corresponding trace or interconnect 238 connected to any other composite contact 510 (i.e., every contact 510 is independent of every other contact 510).

Each independent contact 510 is positioned on a corresponding areal region of the semiconductor layer 501 (i.e., a contact area) that is a discrete, circumscribed areal region separated from circumscribed areal regions of all other composite contacts 510 by gaps between the contacts 510. Each contact area defines a corresponding discrete pixel area of the inventive light-emitting device 500; the pixel area typically can be somewhat larger than the corresponding contact area due to lateral spreading of current flowing from the electrode 510 to the junction or active layer 503 through the semiconductor layer 501 and lateral propagation of emitted output light. Although FIGS. 8A and 8B show only three contacts 510 defining three corresponding pixel areas, an inventive light-emitting device 500 can include any suitable number or arrangement of contacts 510 defining corresponding pixel areas of the device, for example on the order of $10^1$, $10^2$, $10^3$, $10^4$, or more contacts 510. Corresponding conductive layers 511 of adjacent contacts 510 can be separated from one another by vacuum, air, or inert gas, or by a liquid or solid electrically insulating material in the gaps between them, so that direct electrical conduction between adjacent composite contacts 510 is substantially prevented. If the contacts 510 include corresponding transparent electrode layers 514, those too can be separated from one another by vacuum, air, inert gas, or by a liquid or solid electrically insulating material.

Emitted light propagating laterally in one or more optical modes could potentially propagate from a pixel area where it was emitted to a different pixel area. If such emitted light were to exit the device 500 from that different pixel area, pixel contrast ratio of the device 500 would be degraded. The set of multiple nanostructured optical elements 580 can be arranged so that, of the light that is emitted within each pixel area at the nominal emission vacuum wavelength $\lambda_0$ and that exits the device 500 through the semiconductor layer 502, (i) at least a specified minimum fraction of the exiting light exits from that pixel area where it was emitted, (ii) at most a specified maximum fraction of the exiting light exits the device from other, different pixel areas, or (iii) a contrast ratio of the fraction of light exiting from the emitting pixel area to the fraction of light exiting one or more adjacent pixel areas exceeds a specified minimum contrast ratio.

So in addition to enhancing overall extraction efficiency from the device 500, the nanostructured optical elements 580 can be arranged to also provide redirection of laterally propagating light emitted in the given pixel area to exit the device 500 from that pixel area, thereby providing contrast between adjacent pixel areas even without any trenches or other structures separating corresponding areas of the semiconductor layer 501, the junction or active layer 503, or the semiconductor layer 502. As noted above, such trenches, typically formed by etching, unavoidably include defect sites that result in non-radiative carrier recombination and concomitant decrease of internal quantum efficiency. The fraction of drive current lost to such non-radiative recombination increases with decreasing pixel area, which decreases quadratically while the pixel perimeter (where etch defects are located) decreases only linearly. Defining distinct, discrete pixel areas using discrete contacts 510 and the nanostructured optical elements 580, while the semiconductor layers 501 and 502, and the junction or active layer 503 between them, remain coextensive over a contiguous area of the device 500, eliminates that source of non-radiative recombination. In addition, fabrication of light-emitting devices 500 can be simpler, less expensive, and higher-yield when fabrication steps related to forming inter-pixel trenches are omitted.

In some examples, each electrode area can have a non-zero transverse size (i.e., largest transverse dimension, e.g., longest side of a rectangular or triangular contact, diameter of a circular contact, major axis of an elliptical contact, and so forth) that is less than about 0.1 mm, less than about 0.05 mm, less than about 0.02 mm, less than about 0.01 mm, less than about 0.005 mm, less than about 0.003 mm, or less than about 0.002 mm. In some examples, non-zero separation between adjacent composite electrical contacts 510 can be less than about 0.1 mm, less than about 0.05 mm, less than about 0.02 mm, less than about 0.01 mm, less than about 0.005 mm, less than about 0.003 mm, or less than about 0.002 mm. In some examples, particularly for smaller contacts 510, the separation between adjacent contacts 510 can be about equal to their transverse size. There is no minimum required separation between adjacent contacts 510, except that the separation must be sufficiently large so that there is no direct electrical contact between adjacent, independent contacts 510.

The reduced overall thickness of the semiconductor layers 501 and 502 and the junction or active layer 503 between them, as noted above, reduces the number of laterally propagating optical modes supported by the semiconductor layer structure of the device 500, so that the nanostructured optical elements 580 can be more effectively optimized for redirecting such laterally propagating light to exit the device 500 through the semiconductor layer 502. In addition to increased extraction efficiency as described above, that more effective optimization also reduces or substantially eliminates lateral propagation of emitted light into adjacent pixel areas. Because any light that does reach a different pixel area necessarily was not very efficiently redirected by the nanostructured optical elements 580 within the emitting pixel area, it is also unlikely to be so redirected in any other pixel area, and so is less likely to degrade contrast between pixel areas.

In some examples, arrangement of the multiple nanostructured optical elements 580 can result in at least the specified minimum fraction of light emitted within each pixel area exiting the device 500 from that pixel area. In some of those examples, the specified minimum fraction can be greater than about 50%, greater than about 75%, greater than about 90%, greater than about 95%, greater than about 98%, or greater than about 99%. In some examples, arrangement of the multiple nanostructured optical elements 580 can result in at most the specified maximum fraction of light emitted within each pixel area exiting the device 500 from other, different pixel areas. In some of those examples, the specified maximum fraction can be less than about 50%, less than about 25%, less than about 10%, less than about 5%, less than about 2%, or less than about 1%. In some examples, arrangement of the multiple nanostructured optical elements 580 can result in the contrast ratio of the fraction of light exiting from that pixel area where it was emitted to the fraction of that light exiting one or more adjacent pixels areas exceeds the specified minimum contrast ratio. In some of those examples, the specified minimum contrast ratio is greater than about 20:1, greater than about 50:1, greater than about 100:1, greater than about 200:1, or greater than about 500:1.

Reduced thickness of the semiconductor layer structure of the device 500 can enhance contrast between adjacent pixel areas in other ways. Decreased thickness of the semiconductor layer 501 results in less lateral spread of drive current injected via the contacts 510 before reaching the junction or active layer 503. As a result, leakage of current injected in one pixel area is less likely to result in radiative recombination and light emission from an adjacent pixel area. The generally lower conductivity of a p-type semiconductor layer 501 can enhance that effect. In addition, light propagating generally toward the contact 510 or the exit surface of the device 500, but off normal, travels a smaller lateral distance before encountering a surface (reflective or transmissive), and is therefore more likely to exit the device 500 within or near the pixel area from which it was emitted, compared to a device with thicker semiconductor layers.

In some examples (with or without discrete pixel areas), the set of multiple nanostructured optical elements 580 can be positioned at the first surface of the semiconductor layer 501, i.e., near the contacts 510 (e.g., as in FIG. 8A). Each nanostructured optical element 580 in such examples can be arranged as one or more volumes of dielectric material protruding into the semiconductor layer 501 or into the corresponding dielectric layer 512 of each composite electrical contact 510 (e.g., as in FIGS. 9B-9E). In some examples the set of multiple nanostructured optical elements 580 can be positioned at the surface of the semiconductor layer 502 opposite the semiconductor layer 501, i.e., at the exit surface of the device 500 (e.g., as in FIG. 8B). Each nanostructured optical element 580 in such examples can be arranged as one or more volumes of dielectric material protruding into the semiconductor layer 502 or into a dielectric layer or medium on the surface of the semiconductor layer 502. In some examples, corresponding arrays of nanostructured optical elements 580 can be positioned at both of those locations. The nanostructured optical elements 580 can be characterized by an element size relative to the nominal emission vacuum wavelength $\lambda_0$ and by an element shape, and the set of multiple nanostructured optical elements 580 can be arranged as an array of elements characterized by at least one element spacing relative to the nominal emission vacuum wavelength $\lambda_0$. The at least one element spacing can be sub-wavelength or larger than the nominal vacuum wavelength $\lambda_0$. The element size and shape and the at least one element spacing are selected so as to result in the redirection of laterally propagating emitted light at the nominal emission vacuum wavelength $\lambda_0$ so that a fraction of that light exits the device through the second semiconductor layer.

Figure 9A:
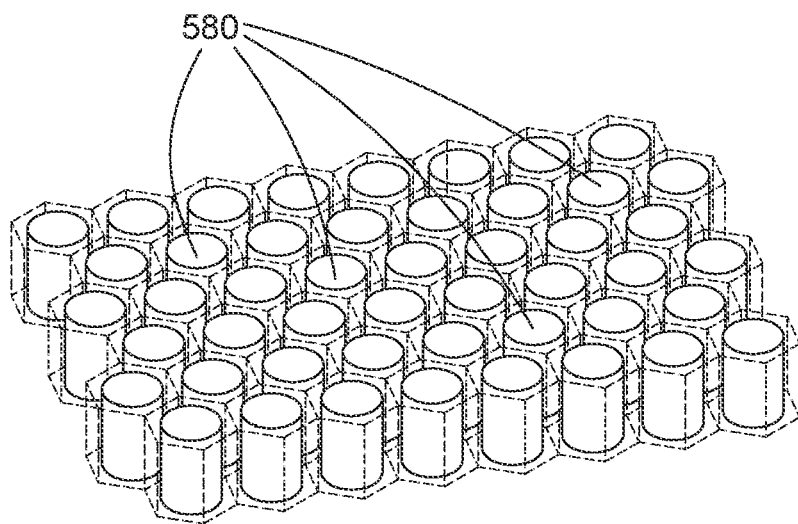
FIG. 9A is an enlarged schematic representation of an example of a set of nanostructured optical elements; the particular example shown includes cylindrical elements in hexagonal grid arrangement.
Figure 9B:
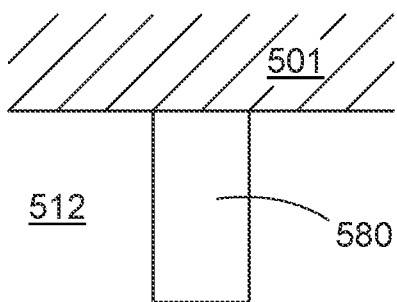
FIGS. 9B-9E illustrate schematically different examples of individual nanostructured optical elements.
Figure 9C:
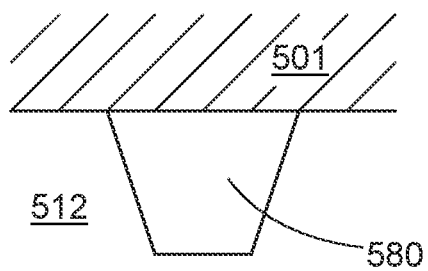
Figure 9D:
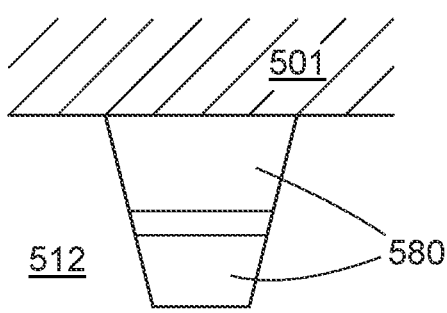
Figure 9E:
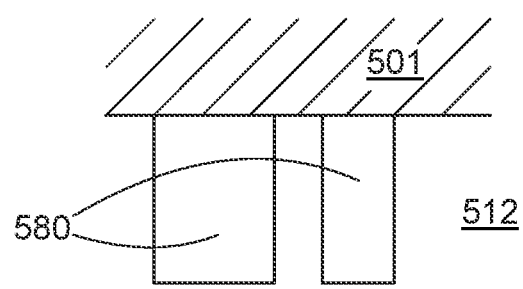

In some examples the nanostructured optical elements 580 can include doped or undoped silica, one or more doped or undoped metal or semiconductor oxides, nitrides, or oxynitrides, or combinations or mixtures thereof. In some examples, the nanostructured optical elements 580 can be formed as voids in the dielectric layer 512, semiconductor layer 501, or semiconductor layer 502. In some examples the dielectric material of the nanostructured optical elements 580 can differ, with respect to refractive index, from the corresponding dielectric layer 512 of each composite electrical contact, or from a dielectric layer or medium on the surface of the semiconductor layer 502. That need not be the case in examples wherein the nanostructured optical elements 580 extend into the semiconductor layer 501 or 502. In some examples the nanostructured optical elements are characterized by an element height between about 0.05 µm and about 0.5 µm or an element width between about 0.1 µm and about 1.0 µm. In some examples the element shape can include one or more of: right or oblique, circular or elliptical cylindrical (e.g., as in FIG. 9B); right or oblique conical or frusto-conical (e.g., as in FIG. 9C); right or oblique pyramidal or frusto-pyramidal; right or oblique polygonal prismatic; polyhedral; or vertical, horizontal, or coaxial dimers (e.g., as in FIGS. 9D and 9E). In some examples, at least one element spacing is between about 0.15 µm and about 0.5 µm, or between about 0.18 µm and about 0.4 µm. In some examples, the set of nanostructured optical elements 580 can be arranged as a trigonal, rectangular, or hexagonal grid or in an aperiodic, irregular, or random arrangement. The example shown in FIG. 9A includes right circular cylindrical elements 580 in a regular hexagonal grid arrangement; other suitable shapes and arrangements of elements 580 can be employed.

Typically, calculation or computer simulation is required to achieve at least a preliminary design for the set of nanostructured optical elements 100; in some instances, a final design can be achieved by iterative experimental optimization of the various parameters by fabricating and characterizing test devices. Note that a set of nanostructured optical elements 580 that is not necessarily fully optimized can nevertheless provide an adequate level of redirection to provide the desired behavior of the light-emitting device 500. Such partly optimized sets of elements 580 fall within the scope of the present disclosure or appended claims. Examples of suitable nanostructured optical elements 580 can be found in, e.g., (i) U.S. Pat. Pub. No. 2020/0200955 entitled "High brightness directional direct emitter with photonic filter of angular momentum" published Jun. 25, 2020 in the names of Antonio Lopez-*Julia* and Venkata Ananth Tamma, (ii) U.S. non-provisional application Ser. No. 17/119,528 entitled "Light-emitting device assembly with light redirection or incidence-angle-dependent transmission through an escape surface" filed Dec. 11, 2020 in the names of Antonio Lopez-Julia and Venkata Ananth Tamma, (iii) Li et al, "All-Dielectric Antenna Wavelength Router with Bidirectional Scattering of Visible Light," *Nano Letters*, 16 4396 (2016), (iv) Shibanuma et al, "Experimental Demonstration of Tunable Directional Scattering of Visible Light from All-Dielectric Asymmetric Dimers," *ACS Photonics*, 4 489 (2017), (v) Wierer et al, "InGaN/GaN quantum-well heterostructure light-emitting diodes employing photonic crystal structures," *Applied Physics Letters*, 84 3885 (2004), and (vi) Wierer et al, *Nature Photonics*, 3 163 (2009), each of which is incorporated by reference as if fully set forth herein.

In some examples, the exit surface of the light-emitting device 500 can include an anti-reflection coating on the surface of the semiconductor layer 502 opposite the semiconductor layer 501. Any suitable anti-reflection coating can be employed, e.g., a single quarter-wave layer, a multilayer dielectric stack, a so-called moth's-eye structure, and so forth.

An inventive light-emitting device 500 can be connected to a drive circuit 302 connected to the first and second sets of contacts 510/520 by corresponding electrical traces or interconnects 238. The traces or interconnects 238 that connect independent contacts 510 to the drive circuit 302 are themselves also independent of one another ("independent" as defined above). Note that in some examples multiple contacts 510 can be connected to a single, common trace or interconnect 238; in such an instance those commonly connected contacts 510 act collectively as a single contact, that is independent of other contacts 510 not connected to the same trace 238. Perhaps more typically, in some examples each contact 510 and its corresponding pixel area can be connected to a trace or interconnect 238 that is independent of all others, so that each pixel area is addressable independently of any other pixel area. The drive circuit 302 can be arranged in any suitable way and can include any suitable set of components or circuit elements, including but not limited to analog components, digital components, active components, passive components, ASICs, computer components (e.g., processors, memory, or storage media), analog-to-digital or digital-to-analog converters, and so forth. The drive circuit 302 provides electrical drive current that flows through the device 500 and causes it to emit light. The drive circuit 302 can be further structured and connected so that (i) corresponding portions of the electrical drive current flow through one or more of the contacts 510 and their corresponding pixel areas as corresponding pixel currents, and (ii) each pixel current magnitude can differ from the corresponding pixel current magnitude of at least one other pixel area, or any other pixel area. In other words, the pixel current magnitudes can differ among the different contacts 510 and corresponding pixel areas, and the spatial distribution of those pixel current magnitudes determines the spatial distribution of light emission intensity across the different pixel areas of the inventive deice 500.

A method for using the inventive light-emitting device 500 comprises: (A) selecting a first specified spatial distribution of pixel current magnitudes; and (B) operating the drive circuit 302 to provide the first specified spatial distribution of pixel current magnitudes to the contacts 510 of the device 500, causing it to emit light according to a corresponding first spatial distribution of light emission intensity across the device 500. The method can further include: (C) selecting a second specified spatial distribution of pixel current magnitudes that differs from the first specified spatial distribution of pixel current magnitudes; and (D) operating the drive circuit 302 to provide the second specified spatial distribution of pixel current magnitudes to the contacts 510 of the device 500, causing it to emit light according to a corresponding second spatial distribution of light emission intensity across the device 500 that differs from the first spatial distribution of light emission intensity.

A method for making an inventive light-emitting device 500 comprises: (A) forming the first and second semiconductor layers 501 and 502 with the junction or active layer 503 between them; (B) forming the first set of one or more electrical contacts 510 in electrical contact with the first semiconductor layer 501; and (C) forming the second set of one or more contacts 520 in electrical contact with the second semiconductor layer 502. The method can further comprise: (C) forming one or more traces or interconnects 238 connected to the contacts 510 and 520, and (D) connecting the drive circuit 302 to the light-emitting device 500 using the traces or interconnects 238.

In addition to the preceding, the following example embodiments fall within the scope of the present disclosure or appended claims:

Example 1. A semiconductor light-emitting device comprising: (a) first and second doped semiconductor layers that are arranged for emitting light at a nominal emission vacuum wavelength $\lambda_0$ resulting from carrier recombination at a junction or active layer between the first and second semiconductor layers, the first and second semiconductor layers and the junction or active layer being coextensive over a contiguous area of the device; (b) a first set of one or more electrical contacts in electrical contact with the first semiconductor layer at a first surface thereof opposite the second semiconductor layer, each electrical contact of the first set being a composite electrical contact comprising (i) a corresponding electrically conductive layer extending over a corresponding areal region of the first surface of the first semiconductor layer within the contiguous area of the device, (ii) a corresponding substantially transparent dielectric layer between the corresponding conductive layer and the first semiconductor layer, and (iii) one or more corresponding electrically conductive vias through the corresponding dielectric layer, each via providing a localized, circumscribed electrical connection between the corresponding conductive layer and the first semiconductor layer; (c) a second set of one or more electrical contacts in electrical contact with the second semiconductor layer; and (d) a set of multiple nanostructured optical elements arranged, at the first surface of the first semiconductor layer or at a surface of the second semiconductor layer opposite the first semiconductor layer, so as to redirect at least a portion of light at the nominal emission vacuum wavelength $\lambda_0$ propagating laterally in one or more selected optical modes supported by the first and second semiconductor layers to exit the device through the second semiconductor layer.

Example 2. The semiconductor light-emitting device of Example 1, each composite electrical contact further comprising a corresponding substantially transparent electrode layer between the corresponding dielectric layer and the first semiconductor layer and in electrical contact with the first semiconductor layer, each via providing the electrical connection between the corresponding conductive layer and the first semiconductor layer by providing an electrical connection between the corresponding conductive layer and the corresponding electrode layer.

Example 3. The device of Example 1, (i) the first set of one or more electrical contacts including multiple independent composite electrical contacts, with each corresponding areal region of the first surface of the first semiconductor layer being a discrete, circumscribed areal region separated from circumscribed areal regions of all other composite contacts of the device so as to define a corresponding discrete pixel area of the light-emitting device, and (ii) the set of multiple nanostructured optical elements being arranged so that, of light emitted within each pixel area at the nominal emission vacuum wavelength $\lambda_0$ and that exits the device through the second semiconductor layer, (i) at least a specified minimum fraction of the exiting light exits from that pixel area, (ii) at most a specified maximum fraction of the exiting light exits the device from other, different pixel areas, or (iii) a contrast ratio of the fraction of light exiting from that pixel area to the fraction of light exiting one or more adjacent pixel areas exceeds a specified minimum contrast ratio.

Example 4. The device of Example 3, the conductive layers of the multiple composite contacts being separated from one another by electrically insulating material so that direct electrical conduction between adjacent composite contacts is substantially prevented.

Example 5. The semiconductor light-emitting device of Example 1, each composite electrical contact further comprising a corresponding substantially transparent, circumscribed, discrete electrode layer between the corresponding dielectric layer and the first semiconductor layer and in electrical contact with the first semiconductor layer, the one or more corresponding vias providing the electrical connection between the corresponding conductive layer and the first semiconductor layer by providing an electrical connection between the corresponding conductive layer and the corresponding electrode layer.

Example 6. The device of Example 5, the electrode layers of the multiple composite contacts being separated from one another by electrically insulating material so that direct electrical conduction between adjacent composite contacts is substantially prevented.

Example 7. The device of any one of Examples 2, 5, or 6, the electrode layer of each composite contact including one or more of indium tin oxide, indium zinc oxide, one or more other transparent conductive oxides, or combinations or mixtures thereof.

Example 8. The device of any one of Examples 1 through 7, the electrically conductive layer or the one or more vias of each composite contact including one or more metals or metal alloys.

Example 9. The device of any one of Examples 3 through 8, the corresponding dielectric layer of each composite contact including doped or undoped silica, one or more doped or undoped metal or semiconductor oxides, nitrides, or oxynitrides, or combinations or mixtures thereof.

Example 10. The device of any one of Examples 3 through 9 further comprising a set of multiple independent electrically conductive traces or interconnects connected to the composite contacts, each composite contact being connected to a single corresponding one of the traces or interconnects that is different from a corresponding trace or interconnect connected to at least one other composite contact.

Example 11. The device of any one of Examples 3 through 9 further comprising a set of multiple independent electrically conductive traces or interconnects connected to the composite contacts, each composite contact being connected to a single corresponding one of the traces or interconnects that is different from a corresponding trace or interconnect connected to any other composite contact.

Example 12. The device of any one of Examples 1 through 11, (i) non-zero total thickness of the first and second semiconductor layers and the junction or active layer being less than about 5 µm, less than about 3 µm, less than about 2 µm, less than about 1.5 µm, or less than about 1.0 µm, or (ii) non-zero thickness of the first semiconductor layer being less than about 1.0 µm, less than about 0.8 µm, less than about 0.5 µm, or less than about 0.3 µm.

Example 13. The device of any one of Examples 1 through 12, non-zero thickness of each dielectric layer being greater than 0.1 µm, greater than 0.2 µm, greater than 0.3 µm, or greater than 0.5 µm.

Example 14. The device of any one of Examples 1 through 13, the first and second semiconductor layers supporting at most 15, 10, 8, 5, or 3 laterally propagating optical modes.

Example 15. The device of any one of Examples 1 through 14, each of the first and second semiconductor layers including one or more III-V semiconductor materials, or alloys or mixtures thereof.

Example 16. The device of any one of Examples 1 through 15, the first semiconductor layer being a p-doped semiconductor layer and the second semiconductor layer being an n-doped semiconductor layer.

Example 17. The device of any one of Examples 1 through 16, the device including one or more quantum wells or multi-quantum wells as the active layer between the first and second semiconductor layers.

Example 18. The device of any one of Examples 1 through 17: (i) the set of multiple nanostructured optical elements being positioned at the first surface of the first semiconductor layer, with each nanostructured optical element being arranged as one or more volumes of dielectric material protruding into the first semiconductor layer or into the corresponding dielectric layer of each composite electrical contact and being characterized by an element size relative to the nominal emission vacuum wavelength $\lambda_0$ and by an element shape; (ii) the set of multiple nanostructured optical elements being arranged as an array of elements characterized by at least one element spacing relative to the nominal emission vacuum wavelength $\lambda_0$; and (iii) the element size and shape and the at least one element spacing resulting in the redirection of at least a portion of light at the nominal emission vacuum wavelength $\lambda_0$ propagating laterally in the one or more selected optical modes to exit the device through the second semiconductor layer.

Example 19. The device of Example 18 further comprising an anti-reflection coating on the surface of the second semiconductor layer opposite the first semiconductor layer and arranged so as to reduce reflection of emitted light at the nominal emission vacuum wavelength $\lambda_0$ incident on that surface, relative to reflection at a similar surface lacking the anti-reflection coating.

Example 20. The device of any one of Examples 1 through 17: (i) the set of multiple nanostructured optical elements being positioned at the surface of the second semiconductor layer opposite the first semiconductor layer, with each nanostructured optical element being arranged as one or more volumes of dielectric material protruding into the second semiconductor layer or into a dielectric layer or medium on that surface of the second semiconductor layer and being characterized by an element size relative to the nominal emission vacuum wavelength $\lambda_0$ and by an element shape; (ii) the set of multiple nanostructured optical elements being arranged as an array of elements characterized by at least one element spacing relative to the nominal emission vacuum wavelength $\lambda_0$; and (iii) the element size and shape and the at least one element spacing resulting in the redirection of at least a portion of light at the nominal emission vacuum wavelength $\lambda_0$ propagating laterally in the one or more selected optical modes to exit the device through the second semiconductor layer.

Example 21. The device of any one of Examples 1 through 20, the nanostructured optical elements including doped or undoped silica, one or more doped or undoped metal or semiconductor oxides, nitrides, or oxynitrides, or combinations or mixtures thereof.

Example 22. The device of any one of Examples 1 through 21, the dielectric material of the nanostructured optical elements differing, with respect to refractive index, from the corresponding dielectric layer of each composite electrical contact or from a dielectric layer or medium on the surface of the second semiconductor layer opposite the first semiconductor layer.

Example 23. The device of any one of Examples 1 through 22, the nominal emission vacuum wavelength $\lambda_0$ being between about 0.30 µm and about 2.5 µm, between about 0.35 µm and about 0.8 µm, or between about 0.7 µm and about 1.7 µm.

Example 24. The device of any one of Examples 1 through 23, the nanostructured optical elements being characterized by an element height between about 0.05 µm and about 0.5 µm or an element width between about 0.1 µm and about 1.0 µm.

Example 25. The device of any one of Examples 1 through 24, the element shape including one or more of: right or oblique, circular or elliptical cylindrical; right or oblique conical or frusto-conical; right or oblique pyramidal or frusto-pyramidal; right or oblique polygonal prismatic; polyhedral; or vertical, horizontal, or coaxial dimers.

Example 26. The device of any one of Examples 1 through 25, the at least one element spacing being between about 0.15 µm and about 0.5 µm, or between about 0.18 µm and about 0.4 µm.

Example 27. The device of any one of Examples 1 through 26, the set of nanostructured optical elements being arranged as a trigonal, rectangular, or hexagonal grid or in an aperiodic, irregular, or random arrangement.

Example 28. The device of any one of Examples 3 through 27, the set of multiple nanostructured optical elements being arranged so that, of the light emitted within each pixel area at the nominal emission vacuum wavelength $\lambda_0$ and that exits the device through the second semiconductor layer, at least the specified minimum fraction of the exiting light exits from that pixel area, and the specified minimum fraction is greater than about 50%, greater than about 75%, greater than about 90%, greater than about 95%, greater than about 98%, or greater than about 99%.

Example 29. The device of any one of Examples 3 through 28, the set of multiple nanostructured optical elements being arranged so that, of the light emitted within each pixel area at the nominal emission vacuum wavelength $\lambda_0$ and that exits the device through the second semiconductor layer, at most the specified maximum fraction of the exiting light exits the device from other, different pixel areas, and the specified maximum fraction is less than about 50%, less than about 25%, less than about 10%, less than about 5%, less than about 2%, or less than about 1%.

Example 30. The device of any one of Examples 3 through 29, the set of multiple nanostructured optical elements being arranged so that, of the light emitted within each pixel area at the nominal emission vacuum wavelength $\lambda_0$ and that exits the device through the second semiconductor layer, the contrast ratio of the fraction of light exiting from that pixel to the fraction of light exiting one or more adjacent pixels exceeds the specified minimum contrast ratio, and the specified minimum contrast ratio is greater than about 20:1, greater than about 50:1, greater than about 100:1. greater than about 200:1. or greater than about 500:1.

Example 31. The device of any one of Examples 10 through 30, each pixel area being addressable independently of at least one other pixel area.

Example 32. The device of any one of Examples 11 through 31, each pixel area being addressable independently of any other pixel area.

Example 33. The device of any one of Examples 3 through 32, each pixel area having a non-zero largest transverse dimension that is less than about 0.1 mm, less than about 0.05 mm, less than about 0.02 mm, less than about 0.01 mm, less than about 0.005 mm, less than about 0.003 mm, or less than about 0.002 mm.

Example 34. The device of any one of Examples 3 through 33, non-zero separation between adjacent composite electrical contacts being less than about 0.1 mm, less than about 0.05 mm, less than about 0.02 mm, less than about 0.01 mm, less than about 0.005 mm, less than about 0.003 mm, or less than about 0.002 mm.

Example 35. The device of any one of Examples 1 through 34, the second set of one or more electrical contacts including one or more substantially transparent electrodes at the surface of the second semiconductor layer opposite the first semiconductor layer.

Example 36. The device of any one of Examples 1 through 35, the second set of one or more electrical contacts being connected to the second semiconductor layer by one or more secondary vias passing through and electrically insulated from the first semiconductor layer and the junction or active layer, each secondary via providing a localized, circumscribed electrical connection between the corresponding contact of the second set and the second semiconductor layer.

Example 37. The device of any one of Examples 1 through 36, the second set of one or more electrical contacts including one or more edge contacts or one or more peripheral areal contacts.

Example 38. The device of any one of Examples 10 through 37 further comprising a drive circuit connected to the first and second sets of contacts by the electrical traces or interconnects, the drive circuit being structured and connected so as to provide electrical drive current that flows through the device and causes the device to emit light, and that is further structured and connected so that (i) corresponding portions of the electrical drive current flow through one or more corresponding pixel areas as corresponding pixel currents, and (ii) each pixel current magnitude differs from the corresponding pixel current magnitude of at least one other of the pixel areas of the device.

Example 39. A method for using the device of Example 38, the method comprising: (A) selecting a first specified spatial distribution of pixel current magnitudes; (B) operating the drive circuit to provide the first specified spatial distribution of pixel current magnitudes to the pixel areas of the device, causing the device to emit light according to a corresponding first spatial distribution of light emission intensity across the device; (C) selecting a second specified spatial distribution of pixel current magnitudes that differs from the first specified spatial distribution of pixel current magnitudes; and (D) operating the drive circuit to provide the second specified spatial distribution of pixel current magnitudes to the pixel areas of the device, causing the device to emit light according to a corresponding second spatial distribution of light emission intensity across the device that differs from the first spatial distribution of light emission intensity.

Example 40. A method for making the light-emitting device of Example 38, the method comprising: (A) forming the first and second semiconductor layers with the junction or active layer between them; (B) forming the first set of one or more electrical contacts in electrical contact with the first semiconductor layer; (C) forming the second set of one or more contacts in electrical contact with the second semiconductor layer; (D) forming the set of multiple nanostructured optical elements; (E) forming one or more electrical traces or interconnects connected to the first and second sets of electrical contacts; and (F) connecting the drive circuit to the first and second sets of electrical contacts using the electrical traces or interconnects.

Example 41. A method for making the light-emitting device of any one of Examples 1 through 38, the method comprising: (A) forming the first and second semiconductor layers with the junction or active layer between them; (B) forming the first set of one or more electrical contacts in electrical contact with the first semiconductor layer; (C) forming the second set of one or more contacts in electrical contact with the second semiconductor layer; and (D) forming the set of multiple nanostructured optical elements.

This disclosure is illustrative and not limiting. Further modifications will be apparent to one skilled in the art in light of the present disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted.

For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A light-emitting device comprising:
   a continuous diode structure that extends over a continuous area of the device and includes first and second doped semiconductor layers and a junction or active layer therebetween that are arranged for emitting light;
   a first set of multiple composite electrical contacts, the locations of which define an array of independently operable light-emitters in the continuous diode structure, each composite electrical contact extending over a corresponding discrete areal region of the first semiconductor layer within the continuous area of the device and comprising
   an electrically conductive layer,
   a transparent dielectric layer between the conductive layer and the first semiconductor layer, and
   one or more electrically conductive vias that electrically couple the conductive layer to the first semiconductor layer through the dielectric layer;
   a second set of one or more electrical contacts in electrical contact with the second semiconductor layer; and
   a set of multiple nanostructured optical elements arranged, on or in the first semiconductor layer or on or in the second semiconductor layer, so as to redirect at least a portion of light emitted by the continuous diode structure that propagates laterally in one or more optical modes supported by the continuous diode structure to exit the device through the second semiconductor layer.

2. The device of claim 1, each composite electrical contact further comprising a corresponding transparent electrode layer between the dielectric layer and the first semiconductor layer and in electrical contact with the first semiconductor layer, each via electrically coupling the conductive layer and the first semiconductor layer by electrically coupling the conductive layer and the electrode layer.

3. The device of claim 1,
   each areal region of the first semiconductor layer being a discrete, circumscribed areal region separated from circumscribed areal regions of all other composite contacts of the device so as to define a corresponding discrete pixel area of the light-emitting device, and
   the set of multiple nanostructured optical elements being arranged so that, of light that is emitted within each pixel area and that exits the device through the second semiconductor layer, (i) at least a specified minimum fraction of the exiting light exits from that pixel area, (ii) at most a specified maximum fraction of the exiting light exits the device from other, different pixel areas, or (iii) a contrast ratio of the fraction of light exiting from that pixel area to the fraction of light exiting one or more adjacent pixel areas exceeds a specified minimum contrast ratio.

4. The device of claim 3, each composite electrical contact including a corresponding transparent, circumscribed, discrete electrode layer between the corresponding dielectric layer and the first semiconductor layer and in electrical contact with the first semiconductor layer, each via electrically coupling the conductive layer and the first semiconductor layer by electrically coupling the conductive layer and the electrode layer.

5. The device of claim 4, the electrode layers of the multiple composite contacts being separated from one another by electrically insulating material so that direct electrical conduction between adjacent composite contacts is substantially prevented.

6. The device of claim 3, the conductive layers of the multiple composite contacts being separated from one another by electrically insulating material so that direct electrical conduction between adjacent composite contacts is substantially prevented.

7. The device of claim 3, the set of multiple nanostructured optical elements being arranged so that, of the light that is emitted within each pixel area and that exits the device through the second semiconductor layer, (i) at least 50% of the exiting light exits from that pixel area, (ii) at most 50% of the exiting light exits the device from other, different pixel areas, or (iii) the contrast ratio of the fraction of light exiting from that pixel to the fraction of light exiting one or more adjacent pixels is greater than about 20:1.

8. The device of claim 3, each pixel area having a non-zero largest transverse dimension that is less than about 0.1 mm, or non-zero separation between adjacent composite electrical contacts being less than about 0.1 mm.

9. The device of claim 3 further comprising a set of multiple independent electrically conductive traces or interconnects connected to the composite contacts, each composite contact being connected to a single corresponding one of the traces or interconnects that is different from a corresponding trace or interconnect connected to at least one other composite contact.

10. The device of claim 9, each pixel area being addressable independently of at least one other pixel area.

11. The device of claim 9 further comprising a drive circuit connected to the first and second sets of contacts by the electrical traces or interconnects, the drive circuit being structured and connected so as to provide electrical drive current that flows through the device and causes the device to emit light, and that is further structured and connected so that (i) corresponding portions of the electrical drive current flow through one or more corresponding pixel areas as corresponding pixel currents, and (ii) each pixel current magnitude differs from the pixel current magnitude of at least one other of the pixel areas of the device.

12. A method for using the device of claim 11, the method comprising:
 (A) selecting a first specified spatial distribution of pixel current magnitudes;
 (B) operating the drive circuit to provide the first specified spatial distribution of pixel current magnitudes to the pixel areas of the device, causing the device to emit light according to a corresponding first spatial distribution of light emission intensity across the device;
 (C) selecting a second specified spatial distribution of pixel current magnitudes that differs from the first specified spatial distribution of pixel current magnitudes; and
 (D) operating the drive circuit to provide the second specified spatial distribution of pixel current magnitudes to the pixel areas of the device, causing the device to emit light according to a corresponding second spatial distribution of light emission intensity across the device that differs from the first spatial distribution of light emission intensity.

13. The device of claim 1, wherein non-zero thickness of each dielectric layer is greater than 0.1 µm.

14. The device of claim 1, wherein (i) non-zero total thickness of the continuous diode structure is less than about 5 µm, or (ii) non-zero thickness of the first semiconductor layer is less than about 1.0 µm.

15. The device of claim 1, the continuous diode structure supporting at most 15 laterally propagating optical modes.

16. The device of claim 1:
 each nanostructured optical element being arranged as one or more volumes of dielectric material protruding into the first semiconductor layer or into the corresponding dielectric layer of each composite electrical contact and being characterized by an element shape and by an element size relative to a nominal emission vacuum wavelength $\lambda_0$ of the light emitted by the diode structure;
 the set of multiple nanostructured optical elements being arranged as an array of elements characterized by at least one element spacing relative to the nominal emission vacuum wavelength $\lambda_0$; and
 the element size and shape and the at least one element spacing resulting in the redirection of at least a portion of the light emitted by the continuous diode structure that propagates laterally in the one or more optical modes to exit the device through the second semiconductor layer.

17. The device of claim 16 further comprising an anti-reflection coating on an exit surface of the device.

18. The device of claim 1:
 each nanostructured optical element being arranged as one or more volumes of dielectric material protruding into the second semiconductor layer or into a dielectric layer or medium on the second semiconductor layer and being characterized by an element shape and by an element size relative to a nominal emission vacuum wavelength $\lambda_0$ of the light emitted by the diode structure;
 the set of multiple nanostructured optical elements being arranged as an array of elements characterized by at least one element spacing relative to the nominal emission vacuum wavelength $\lambda_0$; and
 the element size and shape and the at least one element spacing resulting in the redirection of at least a portion of the light emitted by the continuous diode structure that propagates laterally in the one or more optical modes to exit the device through the second semiconductor layer.

19. The device of claim 1, the nanostructured optical elements being characterized by an element height between about 0.05 µm and about 0.5 µm, by an element width between about 0.1 µm and about 1.0 µm, or at least one element spacing between about 0.15 µm and about 0.5 µm.

20. A method for making a light-emitting device, the method comprising:
 (A) forming a continuous diode structure that extends over a continuous area of the device and includes first and second doped semiconductor layers and a junction or active layer therebetween that are arranged for emitting light;
 (B) forming a first set of multiple composite electrical contacts, the locations of which define an array of independently operable light-emitters in the continuous diode structure, each composite electrical contact extending over a corresponding discrete areal region of the first semiconductor layer within the continuous area of the device and comprising
 an electrically conductive layer,
 a transparent dielectric layer between the conductive layer and the first semiconductor layer, and
 one or more electrically conductive vias that electrically couple the conductive layer to the first semiconductor layer through the dielectric layer;
 (C) forming a second set of one or more contacts in electrical contact with the second semiconductor layer; and
 (D) forming a set of multiple nanostructured optical elements arranged, on or in the first semiconductor layer or on or in the second semiconductor layer, so as to redirect at least a portion of light emitted by the continuous diode structure that propagates laterally in one or more optical modes supported by the continuous diode structure to exit the device through the second semiconductor layer.

* * * * *